United States Patent
Cheng et al.

(10) Patent No.: US 12,306,266 B2
(45) Date of Patent: May 20, 2025

(54) MEASURING DC LINK CAPACITANCE IN POWER CONVERSION SYSTEMS

(71) Applicant: Rockwell Automation Technologies, Inc., Mayfield Heights, OH (US)

(72) Inventors: Zhongyuan Cheng, Kitchener (CA); Navid Zargari, Kitchener (CA); Yuan Xiao, Kitchener (CA)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 218 days.

(21) Appl. No.: 18/201,580

(22) Filed: May 24, 2023

(65) Prior Publication Data

US 2024/0402260 A1 Dec. 5, 2024

(51) Int. Cl.
| | |
|---|---|
| *H02M 3/158* | (2006.01) |
| *G01R 27/08* | (2006.01) |
| *G01R 27/26* | (2006.01) |
| *G01R 31/42* | (2006.01) |
| *G01R 31/64* | (2020.01) |

(52) U.S. Cl.
CPC .............. *G01R 31/42* (2013.01); *G01R 27/08* (2013.01); *G01R 27/2605* (2013.01); *G01R 31/64* (2020.01)

(58) Field of Classification Search
CPC .... G01R 31/42; G01R 27/08; G01R 27/2605; G01R 31/64; G01R 31/40
See application file for complete search history.

(56) References Cited

U.S. PATENT DOCUMENTS

| | | | |
|---|---|---|---|
| 9,470,739 B2 | 10/2016 | Govindaraj et al. | |
| 9,651,603 B2 | 5/2017 | Schweizer et al. | |
| 9,812,947 B2 | 11/2017 | Yamamoto et al. | |
| 2014/0136130 A1* | 5/2014 | Nelson | G06F 17/00 702/58 |
| 2015/0369848 A1* | 12/2015 | Shamir | H02J 13/00022 324/127 |

(Continued)

FOREIGN PATENT DOCUMENTS

| | | |
|---|---|---|
| CN | 103630755 A | 9/2016 |
| EP | 3879687 A1 | 9/2021 |

(Continued)

*Primary Examiner* — Muhammad S Islam
(74) *Attorney, Agent, or Firm* — Foley & Lardner LLP

(57) ABSTRACT

A component includes a power suspension module that suspends providing power from a DC source to a DC link capacitor and from the capacitor to a load. A bleeding resistor is connected in parallel with the capacitor and an auxiliary power supply draws power from the capacitor. The component includes a measurement module that measures a first, second and third capacitor voltage at a first, second, time, and third time in response suspending power between the DC source and the load. The component includes a capacitance module that uses bleeding resistor resistance, the voltages and the times to determine a current capacitance of the capacitor, a capacitance comparison module that compares the current capacitance with an initial capacitance of the capacitor, and an alert module that sends an alert in response to determining that a difference between the current capacitance and the initial capacitance is above a capacitance degradation threshold.

20 Claims, 14 Drawing Sheets

(56) References Cited

U.S. PATENT DOCUMENTS

2016/0061877 A1* 3/2016 Marshall ................ G01R 31/64
                                                        324/548
2018/0254779 A1* 9/2018 Omran ................ H03M 1/1009
2019/0379278 A1* 12/2019 Niv ......................... H02M 1/32

FOREIGN PATENT DOCUMENTS

| JP | 5829412 B2 | 12/2015 |
| KR | 101171584 B1 | 8/2012 |
| KR | 20210137837 A | 11/2021 |

* cited by examiner

MEASURING DC LINK CAPACITANCE IN POWER CONVERSION SYSTEMS

BACKGROUND INFORMATION

The subject matter disclosed herein relates to power conversion systems and further relates to measuring direct current ("DC") link capacitance in a power conversion system.

BRIEF DESCRIPTION

A component for measuring DC link capacitance in a power conversion system includes a power suspension module configured to suspend providing DC power from a DC source to a DC link capacitor of a power converter and to suspend providing power from the DC link capacitor to a load of the power converter. A bleeding resistor is connected in parallel with the DC link capacitor and an auxiliary power supply draws power from the DC link capacitor. The auxiliary power supply provides control power for the power converter. The component includes a measurement module configured to measure, using a voltage sensing circuit to measure voltage across the DC link capacitor, a first voltage at a first time, a second voltage at a second time, and a third voltage at a third time in response to the power suspension module suspending power from or to the DC source and power to or from the load. The component includes a capacitance module configured to use a resistance of the bleeding resistor, the first, second and third voltages and the first, second and third times to determine a current capacitance of the DC link capacitor. The component includes a capacitance comparison module configured to compare the current capacitance with an initial capacitance of the DC link capacitor and an alert module configured to send an alert in response to determining that a difference between the current capacitance and the initial capacitance is above a capacitance degradation threshold. At least a portion of the modules include hardware circuits, a programmable hardware device, and/or executable code where the executable code is stored on one or more non-transitory computer readable storage media.

A method for measuring DC link capacitance in a power conversion system includes suspending power flow between a DC source and a DC link capacitor of a power converter and suspending power flow between the DC link capacitor and a load of the power converter. A bleeding resistor is connected in parallel with the DC link capacitor and an auxiliary power supply draws power from the DC link capacitor. The auxiliary power supply provides control power for the power converter. The method includes measuring, using a voltage sensing circuit to measure voltage across the DC link capacitor, a first voltage at a first time, a second voltage at a second time, and a third voltage at a third time in response to suspending power from or to the DC source and power to or from the load. The method includes using a resistance of the bleeding resistor, the first, second and third voltages and the first, second and third times to determine a current capacitance of the DC link capacitor. The method includes comparing the current capacitance with an initial capacitance of the DC link capacitor and sending an alert in response to determining that a difference between the current capacitance and the initial capacitance is above a capacitance degradation threshold.

A computer program product for measuring DC link capacitance in a power conversion system includes a non-transitory computer readable storage medium having program code embodied therein. The program code is executable by a processor to suspend power flow between a direct current ("DC") source and a DC link capacitor of a power converter and to suspend power flow between the DC link capacitor and a load of the power converter. A bleeding resistor is connected in parallel with the DC link capacitor and an auxiliary power supply draws power from the DC link capacitor. The auxiliary power supply provides control power for the power converter. The program code is executable by a processor to measure, using a voltage sensing circuit to measure voltage across the DC link capacitor, a first voltage at a first time, a second voltage at a second time, and a third voltage at a third time in response to suspending power from or to the DC source and power to or from the load. The program code is executable by a processor to use a resistance of the bleeding resistor, the first, second and third voltages and the first, second and third times to determine a current capacitance of the DC link capacitor, compare the current capacitance with an initial capacitance of the DC link capacitor, and send an alert in response to determining that a difference between the current capacitance and the initial capacitance is above a capacitance degradation threshold.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
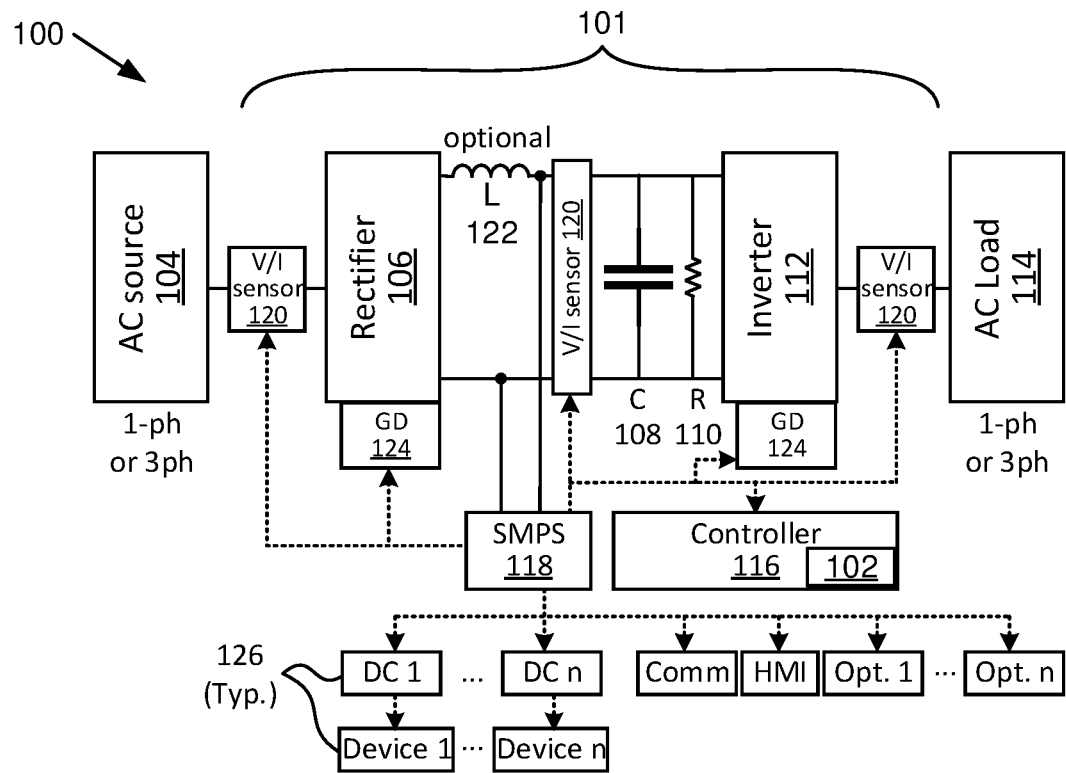
FIG. 1 is a schematic block diagram of a system for measuring DC link capacitance in a power conversion system, according to various embodiments.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. The term "and/or" indicates embodiments of one or more of the listed elements, with "A and/or B" indicating embodiments of element A alone, element B alone, or elements A and B taken together.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

The computer readable medium may be a tangible computer readable storage medium storing the program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable storage medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store program code for use by and/or in connection with an instruction execution system, apparatus, or device.

Program code for carrying out operations for aspects of the present invention may be written in any combination of one or more programming languages, including an object-oriented programming language such as Python, Ruby, R, Java, Java Script, Smalltalk, C++, C sharp, Lisp, Clojure, PHP or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider). The computer program product may be shared, simultaneously serving multiple customers in a flexible, automated fashion.

The schematic flowchart diagrams and/or schematic block diagrams in the Figures illustrate the architecture, functionality, and operation of possible implementations. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Although various arrow types and line types may be employed in the flowchart and/or block diagrams, they are understood not to limit the scope of the corresponding embodiments. Indeed, some arrows or other connectors may be used to indicate only an exemplary logical flow of the depicted embodiment.

The description of elements in each figure may refer to elements of proceeding figures. Like numbers refer to like elements in all figures, including alternate embodiments of like elements.

A component for measuring DC link capacitance in a power conversion system includes a power suspension module configured to suspend power flow between a DC source and a DC link capacitor of a power converter and to suspend power flow between the DC link capacitor and a load of the power converter. A bleeding resistor is connected in parallel with the DC link capacitor and an auxiliary power supply draws power from the DC link capacitor. The auxiliary power supply provides control power for the power converter. The component includes a measurement module configured to measure, using a voltage sensing circuit to measure voltage across the DC link capacitor, a first voltage at a first time, a second voltage at a second time, and a third voltage at a third time in response to the power suspension module suspending power from or to the DC source and power to or from the load. The component includes a capacitance module configured to use a resistance of the bleeding resistor, the first, second and third voltages and the first, second and third times to determine a current capacitance of the DC link capacitor. The component incudes a capacitance comparison module configured to compare the current capacitance with an initial capacitance of the DC link capacitor and an alert module configured to send an alert in response to determining that a difference between the current capacitance and the initial capacitance is above a capacitance degradation threshold. At least a portion of the modules include hardware circuits, a programmable hardware device, and/or executable code where the executable code is stored on one or more non-transitory computer readable storage media.

In some embodiments, the capacitance module determines the current capacitance without measuring or knowing an amount of power drawn by the auxiliary power supply. In other embodiments, the component includes a load module configured to determine that the load is not drawing power and is not providing power to the DC link capacitor in response to the power suspension module suspending power flow between the DC source and the DC link capacitor and suspending power flow between the load and the DC link capacitor. The measurement module measures the first voltage, the second voltage, and/or the third voltage in response to the load module determining that the load is not drawing power and is not providing power to the DC link capacitor. In other embodiments, the load module determines that the load is not drawing power and is not providing power to the DC link capacitor prior to the measurement module determining each of the first voltage, the second voltage, and the third voltage.

In some embodiments, the capacitance module determines the current capacitance using the equation:

$$C = \frac{2\Delta t_1}{R \cdot \ln\left(\frac{V_1^2 - V_2^2}{V_2^2 - V_3^2} \cdot \frac{\Delta t_2}{\Delta t_1}\right)}$$

where:
  C is the current capacitance of the DC link;
  R is resistance of the bleeding resistor;
  $V_1$ is the first voltage;
  $V_2$ is the second voltage;
  $V_3$ is the third voltage;
  $\Delta t_1$ is a time difference between the first time and the second time; and
  $\Delta t_2$ is a time difference between the second time and the third time.

In other embodiments, a time difference between the first time and the second time is equal to a time difference between the second time and the third time. In other embodiments, the capacitance module determines the current capacitance using the equation:

$$C = \frac{2\Delta t}{R \cdot \ln\left(\frac{V_1^2 - V_2^2}{V_2^2 - V_3^2}\right)}$$

where:
  C is the current capacitance of the DC link;
  R is resistance of the bleeding resistor;
  $V_1$ is the first voltage;
  $V_2$ is the second voltage;
  $V_3$ is the third voltage; and
  $\Delta t$ is the time difference between the first time and the second time and/or the time difference between the second time and the third time.

In other embodiments, the capacitance module determines the current capacitance using the equation:

$$C = \frac{(V_{avg1}^2 - V_{avg2}^2)\Delta t}{R\left(V_{avg1}^2 \ln\frac{V_1}{V_2} - V_{avg2}^2 \ln\frac{V_2}{V_3}\right)}$$

where:
  C is the current capacitance of the DC link;
  R is resistance of the bleeding resistor;
  $V_1$ is the first voltage;
  $V_2$ is the second voltage;
  $V_3$ is the third voltage;

$$V_{avg1}^2 = 0.5(V_1 - V_2);$$

$$V_{avg2}^2 = 0.5(V_2 - V_3);$$

and
  $\Delta t$ is the time difference between the first time and the second time and/or the time difference between the second time and the third time.

In some embodiments, the DC link capacitor includes two or more sections of capacitors connected in series and each of the two or more sections of capacitors include a bleeding resistor connected in parallel and the resistance of the bleeding resistor used by the capacitance module includes a resistance of a series equivalent resistance of the bleeding resistors connected in parallel with the two or more sections of capacitors. In other embodiments, the component includes an auxiliary power module configured to calculate the power drawn by the auxiliary power supply using the equation:

$$P = \frac{V_2^4 - V_1^2 V_3^2}{(V_1^2 - 2V_2^2 + V_3^2)R}$$

where:
  P is the power drawn by the auxiliary power supply;
  R is resistance of the bleeding resistor;
  $V_1$ is the first voltage;

$V_2$ is the second voltage; and
$V_3$ is the third voltage.

A method for measuring DC link capacitance in a power conversion system includes suspending power flow between a DC source and a DC link capacitor of a power converter and to suspend providing power from the DC link capacitor to a load of the power converter. A bleeding resistor is connected in parallel with the DC link capacitor and an auxiliary power supply draws power from the DC link capacitor. The auxiliary power supply provides control power for the power converter. The method includes measuring, using a voltage sensing circuit to measure voltage across the DC link capacitor, a first voltage at a first time, a second voltage at a second time, and a third voltage at a third time in response to suspending power from or to the DC source and power to or from the load. The method includes using a resistance of the bleeding resistor, the first, second and third voltages and the first, second and third times to determine a current capacitance of the DC link capacitor. The method includes comparing the current capacitance with an initial capacitance of the DC link capacitor and sending an alert in response to determining that a difference between the current capacitance and the initial capacitance is above a capacitance degradation threshold.

In some embodiments, determining the current capacitance includes determining the current capacitance without measuring or knowing an amount of power drawn by the auxiliary power supply. In other embodiments, the method includes determining that the load is not drawing power and is not providing power to the DC link capacitor in response to suspending power flow between the DC source and the DC link capacitor and suspending power flow between the load and the DC link capacitor. Measuring the first voltage, the second voltage, and/or the third voltage is in response to determining that the load is not drawing power and is not providing power to the DC link capacitor. In other embodiments, determining that the load is not drawing power and is not providing power to the DC link capacitor includes determining that the load is not drawing power and is not providing power to the DC link capacitor prior determining each of the first voltage, the second voltage, and the third voltage.

In some embodiments, determining the current capacitance includes using the equation:

$$C = \frac{2\Delta t_1}{R \cdot \ln\left(\frac{V_1^2 - V_2^2}{V_2^2 - V_3^2} \cdot \frac{\Delta t_2}{\Delta t_1}\right)}$$

wherein:
  C is the current capacitance of the DC link;
  R is resistance of the bleeding resistor;
  $V_1$ is the first voltage;
  $V_2$ is the second voltage;
  $V_3$ is the third voltage;
  $\Delta t_1$ is a time difference between the first time and the second time; and
  $\Delta t_2$ is a time difference between the second time and the third time.

In other embodiments, a time difference between the first time and the second time is equal to a time difference between the second time and the third time. In other embodiments, determining the current capacitance includes using the equation:

$$C = \frac{2\Delta t}{R \cdot \ln\left(\frac{V_1^2 - V_2^2}{V_2^2 - V_3^2}\right)}$$

where:
  C is the current capacitance of the DC link;
  R is resistance of the bleeding resistor;
  $V_1$ is the first voltage;
  $V_2$ is the second voltage;
  $V_3$ is the third voltage; and
  $\Delta t$ is the time difference between the first time and the second time and/or the time difference between the second time and the third time.

In other embodiments, determining the current capacitance includes using the equation:

$$C = \frac{(V_{avg1}^2 - V_{avg2}^2)\Delta t}{R\left(V_{avg1}^2 \ln\frac{V_1}{V_2} - V_{avg2}^2 \ln\frac{V_2}{V_3}\right)}$$

where:
  C is the current capacitance of the DC link;
  R is resistance of the bleeding resistor;
  $V_1$ is the first voltage;
  $V_2$ is the second voltage;
  $V_3$ is the third voltage;

$$V_{avg1}^2 = 0.5(V_1 - V_2);$$

$$V_{avg2}^2 = 0.5(V_2 - V_3);$$

and
  $\Delta t$ is the time difference between the first time and the second time and/or the time difference between the second time and the third time.

In some embodiments, the method includes calculating the power drawn by the auxiliary power supply using the equation:

$$P = \frac{V_2^4 - V_1^2 V_3^2}{(V_1^2 - 2V_2^2 + V_3^2)R}$$

where:
  P is the power drawn by the auxiliary power supply;
  R is resistance of the bleeding resistor;
  $V_1$ is the first voltage;
  $V_2$ is the second voltage; and
  $V_3$ is the third voltage.

A computer program product for measuring DC link capacitance in a power conversion system includes a non-transitory computer readable storage medium having program code embodied therein. The program code is executable by a processor to suspend power flow between a DC source and a DC link capacitor of a power converter and to suspend power flow between the DC link capacitor and a load of the power converter. A bleeding resistor is connected in parallel with the DC link capacitor and an auxiliary power supply draws power from the DC link capacitor. The auxiliary power supply provides control power for the power converter. The program code is executable by a processor to measure, using a voltage sensing circuit to measure voltage across the DC link capacitor, a first voltage at a first time, a second voltage at a second time, and a third voltage at a third time in response to suspending power from or to the DC source and power to or from the load. The program code is executable by a processor to use a resistance of the bleeding resistor, the first, second and third voltages and the first, second and third times to determine a current capacitance of the DC link capacitor. The program code is executable by a processor to compare the current capacitance with an initial capacitance of the DC link capacitor and send an alert in response to determining that a difference between the current capacitance and the initial capacitance is above a capacitance degradation threshold.

FIG. 1 is a schematic block diagram of a system 100 for measuring DC link capacitance in a power conversion system, according to various embodiments. The system 100 includes an alternating current ("AC") source 104 connected to a rectifier 106 that is then connected to a DC link capacitor C 108 with a bleeding resistor R 110. The system 100 includes a capacitance apparatus 102 that measures current capacitance of a DC link capacitor 108 (listed as C 108 in FIG. 1), which provides an improved way to determine if the DC link capacitor 108 has degraded. The capacitance apparatus 102 is described in more detail below.

An inverter 112 is connected to the DC link capacitor 108, which provides power to an AC load 114. The rectifier 106, DC link capacitor 108 and inverter 112 make up the major components of a power converter 101 that receives an AC voltage from the AC source 104 and provides AC power to the AC load 114, which may be at a different frequency and/or amplitude than a fundamental frequency and/or amplitude of the AC source 104. In some embodiments, the power converter 101 includes an inductor L 122, which may be used for filtering, resonance, or the like.

While the inductor L 122, DC link capacitor C 108, and bleeding resistor R 110 of the power converter 101 are depicted as single components, the power converter 101 may include other combinations of inductors, capacitors and bleeding resistors. In some examples, the inductor L 122 may be split between a positive and a negative bus connected to the DC link capacitor C 108. In other embodiments, the DC link capacitor C 108 may include multiple capacitors in series and/or in parallel.

In various embodiments, the DC link capacitor 108 may be single capacitor, or a capacitor bank containing multiple capacitors connected in series or parallel, which may be referred to herein as a section of capacitors. As used herein a section of capacitors includes one or more capacitors. The bleeding resistor 110, in various embodiments, includes a resistor network to discharge the one or more capacitors of the DC link capacitor 108, or to balance the voltage of capacitors of the DC link capacitor 108 in a series connection. When multiple resistors make up a bleeding resistor 110 and are used for balancing voltage, the resistors may also be called balancing resistors. The DC source, in some embodiments, may include DC energy storage such as a DC battery or rectifier converting AC voltage from an AC source 104 to a DC source. The AC load 114 connected to the inverter 112, may also be any power load such a resistive load, an inductive load or a motor.

In other embodiments, the bleeding resistor R 110 may be split into multiple resistors, such as a resistor across each capacitor in series of the DC link capacitor C 108 to help provide even voltage distribution across the capacitors. In other embodiments, the DC link capacitor C 108 and Inductor L 122 may be part of various configurations of a resonance section, such as an inductor-capacitor-inductor ("LCL") resonance section. In some embodiments, the power converter 101 may also include one or more transformers (not shown). One of skill in the art will recognize other power converters 101 where a capacitance apparatus 102 is useful.

The power converter 101 is controlled by a controller 116 that includes the capacitance apparatus 102. The controller 116, in some embodiments, provides signals to gate drives 124 of semiconductor switches of the rectifier 106 and/or inverter 112 and to other control elements. The converter also includes an auxiliary power supply in the form of a switchmode power supply ("SMPS") 118 that provides control power at various DC voltages to the controller 116, the gate drives 124, various voltage and/or current ("V/I") sensors 120, as well as to other devices 126. The other devices 126 may include DC buses DC 1-N and connected Devices 1-N, communication ports ("Comm"), a human interface ("HMI"), Opto-couplers ("OPT") 1-N, and other devices known to those of skill in the art.

The AC source 104 may be single phase (1-ph) or three phase (3-ph). The AC source 104 may be a power distribution panel, a main distribution panel connected to a utility power source, a motor control center, or the like. Typically, the power converter 101 is connected to the AC source 104 via a circuit breaker or other disconnect with overcurrent protection. In some embodiments, the power converter 101 is connected to the AC source 104 with an electronically controlled switch that is able to be operated by the capacitance apparatus 102, controller 116, or higher level controller.

In some embodiments, the rectifier 106 is a full-bridge rectifier. In other embodiments, the rectifier 106 is a half-bridge rectifier. In some embodiments, the rectifier 106 is a passive device with diodes for which the gate drive 124 is not needed, and there is an electronic switch or disconnect available to be controlled directly or indirectly by the capacitance apparatus 102 to disconnect the AC source 104 from the rectifier 106 to prevent power being input to the DC link capacitor 108. In other embodiments, the rectifier is an active device with semiconductor switches each controlled by a gate drive 124 where the capacitance apparatus 102 is able to stop the rectifier 106 from providing power to the DC link capacitor 108.

The inverter 112 is an active device that includes semiconductor switches of some type where the capacitance apparatus 102 is able to stop power transfer to the AC load 114. In some embodiments, the capacitance apparatus 102 controls the semiconductor switches of the inverter 112 through gate drives 124 to stop power from being transferred to the AC load 114, for example, by opening the semiconductor switches of the inverter 112. In some embodiments, the inverter 112 includes an H-bridge power cell or modular multilevel converter ("MMC") power cell with semiconductor switches. In some embodiments, the inverter 112 is able to adjust a frequency of an output voltage to the AC load 114. For example, the power converter 101 may be a variable-frequency drive providing power to a motor where speed of the motor is dependent on the frequency of voltage provided to the motor.

Prior art methods determine a current capacitance of a DC link capacitor 108 using two voltage measurements (2-point method) when there is no power drawn by an auxiliary power supply. The capacitance apparatus 102 beneficially allows determination of a current capacitance of the DC link capacitor 108 without power of an auxiliary power supply 118 being measured or being forced to zero. The capacitance apparatus 102 disconnects power from the rectifier 106 to the DC link capacitor 108 and stops power from the inverter 112 from being transferred to the AC load 114 to isolate the DC link capacitor 108 so that voltage across the DC link capacitor 108 will decay due to the bleeding resistor 110 and load on the SMPS 118, which allows testing of the DC link capacitor 108 to determine a current capacitance. The capacitance apparatus 102 may be used in other power converters 101 with other configurations where power to and from the DC link capacitor 108 is able to be disconnected so that voltage across the DC link capacitor 108 is reduced by the bleeding resistor 110 and power to the SMPS 118. Other uses of the capacitance apparatus 102 are described below with regard to FIGS. 9-11.

The rectifier 106 provides DC power to a DC bus, which may be the input for one or more inverters (e.g., 112), converters, etc. via a DC bus. One or more DC link capacitors 108 are typically connected to the DC bus and provide stability as well as filtering of ripple caused by the rectifier 106. Typically, each DC link capacitor 108 has a bleeding resistor 110 connected in parallel to reduce voltage across the DC link capacitor 108 when the power converter 101 is not running. Often the bleeding resistor 110 has a relatively high resistance to minimize converter power losses. Resistance of the bleeding resistor 110 is typically chosen to balance voltage decay and power loss.

The DC link capacitor 108 typically loses capacitance over time, which eventually may cause failure of the power converter 101. Typically, the DC link capacitor 108 is either an electrolytic capacitor or a film capacitor. An electrolytic capacitor is subject to vaporization or leakage of the electrolyte, which causes a reduction in capacitance. Film capacitors include a feature called self-healing which is a spontaneous extinction of a local electrical arc due to the destruction of electrodes during the extinction process. This self-healing occurs in capacitors made of metallized films of plastics with a thin layer of metal. Self-healing causes a loss of metallization, which leads to a reduction in capacitance of the film capacitors. Another cause of loss of capacitance for film capacitors is moisture, which causes corrosion of metallization of the film capacitors.

Comparing a current capacitance with an initial capacitance, or other reference capacitance determined based on a designed value, is used to determine how much a DC link capacitor 108 has degraded, which can then be used to replace the DC link capacitor 108 and/or power converter 101 in the event that the capacitance of the DC link capacitor 108 is below a capacitance degradation threshold. Some methods of determining a current capacitance of the DC link capacitor 108 include charge-based approaches, which are difficult for varying current and require solving an integral equation. Some charge-based approaches use a constant current to avoid the integration issue, but would require circuitry to force a constant current.

Other energy-based approaches are also used to determine a current capacitance of the DC link capacitor 108. However, the energy-based approaches require measurement of voltage and current, which then requires a current sensor. Impedance-based approaches to determining the current capacitance of the DC link capacitor 108 require injection of power at a specific frequency and require measurement of voltage and current, so again a current sensor is required as well as an injection source capable of injecting power at a particular frequency. Other techniques use a discharge profile of the DC link capacitor 108 to determine a current capacitance, but require measuring power to a load, which would require measurement of power to the auxiliary power SMPS 118.

Use of the capacitance apparatus 102 is advantageous in that the capacitance apparatus 102 is able to measure a current capacitance of the DC link capacitor 108 in situ without knowledge of the capacitor loading situation. Thus, measurement of power to the SMPS 118 is not required. In addition, current measurement from the DC link capacitor 108 is also not required. The capacitance apparatus 102 is able to determine a current capacitance of the DC link capacitor 108 using three measurements of voltage across the DC link capacitor 108 at three points in time. The capacitance apparatus 102 is explained in more detail below.

The power converter 101 includes a controller 116, which in some embodiments, includes the capacitance apparatus 102. The controller 116, in some embodiments, receives control commands from a higher level controller that controls an industrial process, such as an assembly line. In some embodiments, the controller 116 receives commands from a user through a human interface, over a control bus, through a server, etc. In some embodiments, the controller 116 includes a feedback and control system that measures control variables, such as voltage of a DC bus that includes the DC link capacitor 108, voltage output of the inverter 112, or the like. In some embodiments, the controller 116 provides measurements, alarm signals, etc. to a control bus, to a human interface, or the like. Typically, the controller 116 and capacitance apparatus 102 remain operational while the DC link capacitor 108 is isolated from the rectifier 106 and the inverter 112 such that no power is provided by the rectifier 106 or to the inverter 112 during measurement of a current capacitance of the DC link capacitor 108 by the capacitance apparatus 102.

The power converter 101 includes an auxiliary power supply, which may be in the form of a switchmode power supply SMPS 118, and that draws some amount of power in order to provide control power to the power converter 101. A switchmode power supply 118 often draws power from a DC bus supported by the DC link capacitor 108. In other embodiments, the SMPS 118 is replaced by another type of power supply that provides control power and draws power from the DC link capacitor 108. Often, the SMPS 118 is configured to provide one or more DC voltages, such as 12 volts ("V"), 5 V, 2.5 V, etc., depending on voltage requirements of the various loads 126 fed by the SMPS 118. Often, the SMPS 118 draws much less power than the AC load 114. For example, the load of the SMPS 118 may be on the order of 5-50 watts ("W") while the AC load 114 or power drawn by the inverter 112 may be on the order of kilowatts or more. Typically, the SMPS 118 continues to provide power to control components even when the inverter 112 is not providing load to the AC load 114. Where the inverter 112 is replaced by another rectifier or other load, the SMPS 118 provides control power when whatever load is fed by the DC link capacitor 108 is disconnected or is zero.

While the power drawn by the SMPS 118 is small, the power drawn by the SMPS 118 is still significant with respect to the load of the bleeding resistor 110. Thus, the power drawn by the SMPS 118 or other power supply receiving power from the DC link capacitor 108 affects accuracy of any technique used to measure voltage decline during discharge of the DC link capacitor 108 by the bleeding resistor 110.

The power converter 101 typically includes voltage and current sensors 120, which are typically used to measure current and voltage at strategic points within the power converter 101, which provides information for controlling the power converter 101 as well as voltage and current information to a user or external device.

Figure 2:
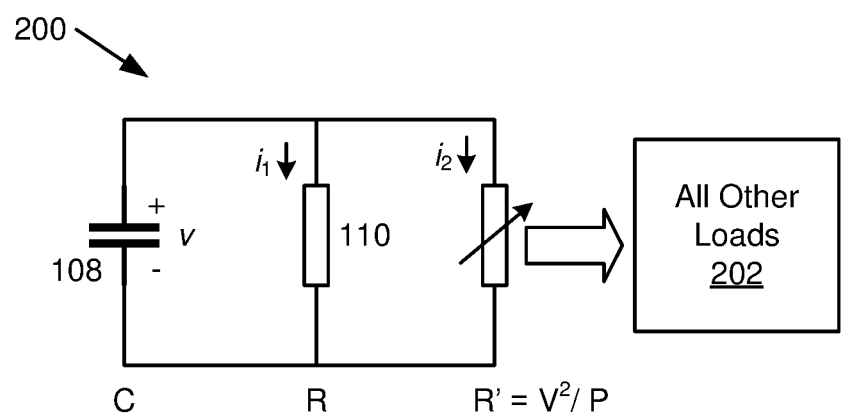
FIG. 2 is a schematic block diagram of an equivalent circuit for measuring DC link capacitance in a power conversion system, according to various embodiments.

FIG. 2 is a schematic block diagram of an equivalent circuit 200 for measuring DC link capacitance in a power conversion system 100, according to various embodiments. Once the capacitance apparatus 102 or other device isolates the DC link capacitor 108 from a source and load, such as the rectifier 106 and inverter 112, the DC link capacitor C 108 remains connected in parallel to the bleeding resistor R 110 and other loads 202, which is typically the SMPS 118. The other loads 202 are represented in the equivalent circuit 200 by R' and may vary during measurement of the capacitance of the DC link capacitor 108.

Figure 3:
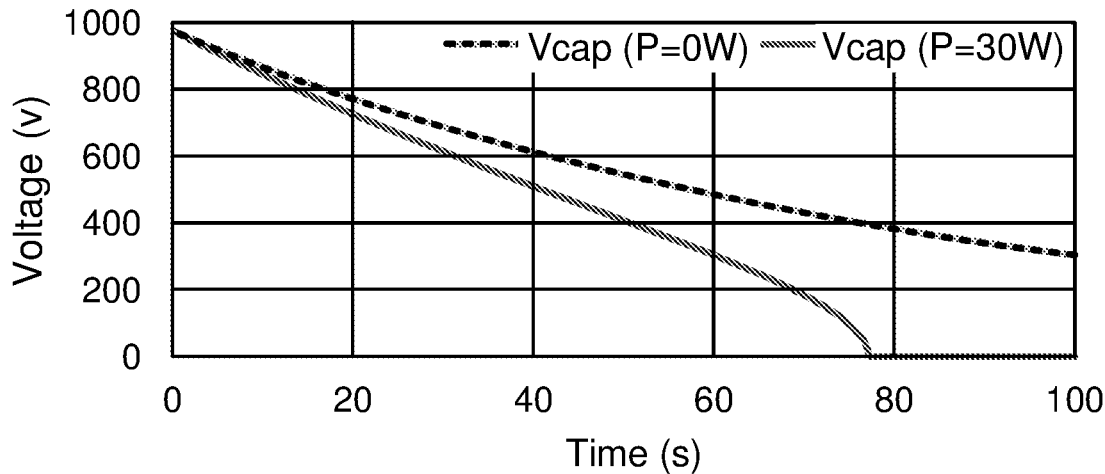
FIG. 3 is a diagram illustrating simulation results for decay of DC link capacitor voltage using a bleeding resistor with or without auxiliary power draw conditions, according to various embodiments.

FIG. 3 is a diagram 300 illustrating simulation results for decay of DC link capacitor voltage V using a bleeding resistor 110 with and without auxiliary power draw conditions, according to various embodiments. One load condition, depicted by the dashed line, is for zero draw by any auxiliary loads, such as by the SMPS 118. The second load condition, depicted by the solid line, is for an auxiliary load of 30 W. Note that the voltage on the DC link capacitor 108 decays much quicker with the 30 W load than with no auxiliary power load.

Figure 4:
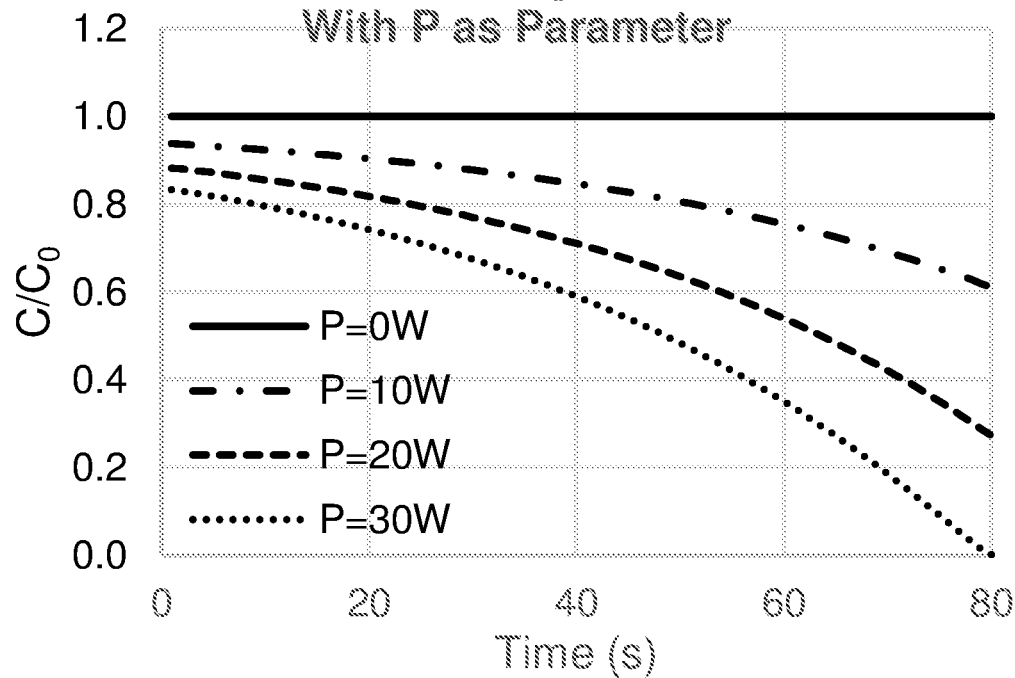
FIG. 4 is a diagram illustrating simulation results for a ratio of measured capacitance and initial capacitance versus time for various auxiliary power conditions, according to various embodiments.

FIG. 4 is a diagram 400 illustrating simulation results for a ratio of measured capacitance C and initial capacitance $C_0$ versus time for various auxiliary power conditions, according to various embodiments. The auxiliary load conditions are for zero power, 10 W, 20 W, and 30 W. The simulation uses a typical 2-point method where voltage across the DC link capacitor 108 is only measured at time $t_1$=zero and again at some other point between zero and 80 seconds. The diagram 400 illustrates calculation results by using a 2-point method continuously in an 80 second observation window and how the 2-point method becomes increasingly inaccurate when not taking into account auxiliary load power, which is generally not known without adding sensors to measure input power to the auxiliary loads.

The equivalent circuit may be represented by equations 1 and 2:

$$-C\frac{dv}{dt} = \frac{v}{R} + \frac{P}{v} \quad (1)$$

$$v^2 = (V_o^2 + PR)e^{-\frac{2t}{RC}} - PR \quad (2)$$

where:
C is the capacitance of DC link capacitor 108;
v is the voltage measured across the DC link capacitor 108;
R is resistance of the bleeding resistor;
P is power drawn by loads other than the bleeding resistor 110 (e.g., SMPS 118);
$V_O$ is the initial voltage of the DC link capacitor 108; and
t is a time constant.

A 3-point current capacitance method may be derived from equation 2 using the following information and formulas where a time constant τ=RC when P is not zero:

| Points | Theoretical Values | Inter. Var. | Eq. |
|---|---|---|---|
| $t_1, V_1$ | $V_1^2 = (V_0^2 + PR)e^{-\frac{2t_1}{RC}} - PR$ | | (3) |
| $t_2 = t_1 + \Delta t_1, V_2$ | $V_2^2 = (V_0^2 + PR)e^{-\frac{2t_1}{RC}}e^{-\frac{2\Delta t_1}{RC}} - PR$ | $V_1^2 - V_2^2$ | (4) |
| $t_3 = t_2 + \Delta t_2, V_3$ | $V_3^2 = (V_0^2 + PR)e^{-\frac{2t_2}{RC}}e^{-\frac{2\Delta t_2}{RC}} - PR$ | $V_2^2 - V_3^2$ | (5) |

From equations 3, 4, and 5, equation 6 may be derived using Taylor's theorem with $\Delta t_1$ and $\Delta t_2 \ll \tau$=RC, wherein τ is the time constant of the RC circuit:

$$\frac{V_1^2 - V_3^2}{V_1^2 - V_2^2} = \frac{1 - e^{-\frac{2\Delta t_2}{RC}}}{1 - e^{-\frac{2\Delta t_1}{RC}}} e^{-\frac{2\Delta t_1}{RC}} \cong \frac{\Delta t_2}{\Delta t_1} e^{-\frac{2\Delta t_1}{RC}} \quad (6)$$

Rearranging Equation 6, the following equations 7(a) and 7(b) are derived:

$$\tau = RC = \frac{2\Delta t_1}{\ln\left(\frac{V_2^2 - V_3^2}{V_1^2 - V_2^2} \cdot \frac{\Delta t_2}{\Delta t_1}\right)} \quad (7(a))$$

$$C = \frac{2\Delta t_1}{R\ln\left(\frac{V_2^2 - V_3^2}{V_1^2 - V_2^2} \cdot \frac{\Delta t_2}{\Delta t_1}\right)} \quad (7(b))$$

Thus, equation 7(b) may be used to determine a current capacitance C of the DC link capacitor 108 without knowing the power P drawn by the loads (e.g., the load on SMPS 118) other than the load of the bleeding resistor R 110. The current capacitance current capacitance C of the DC link capacitor 108 may be measured by measuring voltages $V_1$, $V_2$, and $V_3$ across the DC link capacitor 108 at times $t_1$, $t_2$, and $t_3$. Advantageously, the current capacitance C of the DC link capacitor 108 may be measured using a voltage measurement across the DC link capacitor 108, which is typically available, at particular times after shutting down the rectifier 106 and inverter 112. An input power measurement of the SMPS 118 along with any other load other than the bleeding resistor R are not required. Another advantage is that the measurement of voltage does not have to be at the very moment when the DC link capacitor 108 is first isolated from the DC source and load.

Note that equations 7(a) and 7(b) are applicable to the equivalent circuit of FIG. 2. Where the topology of the power converter 101 is different, a different equivalent circuit for discharge of the DC link capacitor(s) 108, associated bleeding resistors R, and auxiliary loads (e.g., load on SMPS 118) may be derived. However, many common topologies of power converters 101 may be represented using the equivalent circuit of FIG. 2. Once an equivalent circuit is derived, equations similar to equations 1-6, 7(a), and 7(b) may be derived for a 3-point method to determine a current capacitance of the DC link capacitor(s) 108.

Where the time interval between the first time $t_1$ and the second time $t_2$ (e.g., $\Delta t_1$) is the same as the time interval between the second time $t_2$ and the third time $t_3$ (e.g., $\Delta t_2$) so $\Delta t_1 = \Delta t_2 = \Delta t$, the equations for the 3-point measurement method can be simplified:

| Points | Theoretical Values | Inter. Var. | Eq. |
|---|---|---|---|
| $t_1, V_1$ | $V_1^2 = (V_0^2 + PR)e^{-\frac{2t_1}{RC}} - PR$ | | (8) |
| $t_2 = t_1 + \Delta t, V_2$ | $V_2^2 = (V_0^2 + PR)e^{-\frac{2t_1}{RC}}e^{-\frac{2\Delta t}{RC}} - PR$ | $V_1^2 - V_2^2$ | (9) |
| $t_3 = t_2 + \Delta t, V_3$ | $V_3^2 = (V_0^2 + PR)e^{-\frac{2t_1}{RC}}e^{-\frac{4\Delta t}{RC}} - PR$ | $V_2^2 - V_3^2$ | (10) |

Therefore:

$$\frac{V_2^2 - V_3^2}{V_1^2 - V_2^2} = e^{-\frac{2\Delta t}{RC}} \quad (11)$$

Rearranging Equation 11, the following equations 12(a) and 12(b) are derived:

$$\tau = RC = \frac{2\Delta t}{\ln\left(\frac{V_1^2 - V_2^2}{V_2^2 - V_3^2}\right)} \quad (12\text{a})$$

$$C = \frac{2\Delta t}{R\ln\left(\frac{V_1^2 - V_2^2}{V_2^2 - V_3^2}\right)} \quad (12\text{b})$$

Note that equations 12(a) and 12(b) are accurate without needing approximation using Taylor's theorem and the constraint of $\Delta t_1$ and $\Delta t_2 \ll RC$.

Another method that may be used to determine a current capacitance of the DC link capacitor 108 includes using an average voltage for the first and second voltages and using an average voltage for the second and third voltages. The following equations can be used initially:

$$v = V_0 e^{-\frac{t}{\tau}} \quad (13)$$

$$\tau = \frac{RR'}{R + R'} C \quad (14)$$

$$v = V_0 e^{-\frac{t}{RC}} \cdot e^{-\frac{Pt}{V_1^2 C}} \quad (15)$$

From equation 15, the following equations may be derived:

| Points | Theoretical Values | Inter. Var. | Eq. |
|---|---|---|---|
| $t_1, V_1$ | $V_1 = V_0 e^{-\frac{t_1}{RC}} \cdot e^{-\frac{Pt_1}{V_1^2 C}}$ | | (16) |
| $t_2 = t_1 + \Delta t, V_2$ | $V_2 = V_0 e^{-\frac{t_2}{RC}} \cdot e^{-\frac{Pt_2}{V_2^2 C}}$ | $V_{avg1} = 0.5(V_1 - V_2)$ | (17) |
| $t_3 = t_2 + \Delta t, V_3$ | $V_3 = V_0 e^{-\frac{t_3}{RC}} \cdot e^{-\frac{Pt_3}{V_3^2 C}}$ | $V_{avg2} = 0.5(V_2 - V_3)$ | (18) |

Therefore:

$$\ln\frac{V_1}{V_2} = \frac{\Delta t}{C}\left(\frac{1}{R} + \frac{P}{V_{avg1}^2}\right) \quad (19)$$

$$\ln\frac{V_2}{V_3} = \frac{\Delta t}{C}\left(\frac{1}{R} + \frac{P}{V_{avg2}^2}\right) \quad (20)$$

Rearranging Equation 19 and 20, the following equations 21(a) and 21(b) are derived:

$$\tau = RC = \frac{(V_{avg1}^2 - V_{avg2}^2)\Delta t}{V_{avg1}^2 \ln\left(\frac{V_1}{V_2}\right) - V_{avg2}^2 \ln\left(\frac{V_2}{V_3}\right)} \quad (21\text{a})$$

$$C = \frac{(V_{avg1}^2 - V_{avg2}^2)\Delta t}{R\left(V_{avg1}^2 \ln\left(\frac{V_1}{V_2}\right) - V_{avg2}^2 \ln\left(\frac{V_2}{V_3}\right)\right)} \quad (21\text{b})$$

Simulation results have shown that equations 21(a) and 21(b) are more accurate than equations 7(a), 7(b), 21(a), or 21(b) in conditions where there is ripple on the auxiliary power. See FIGS. 7 and 8 below.

Figure 5:
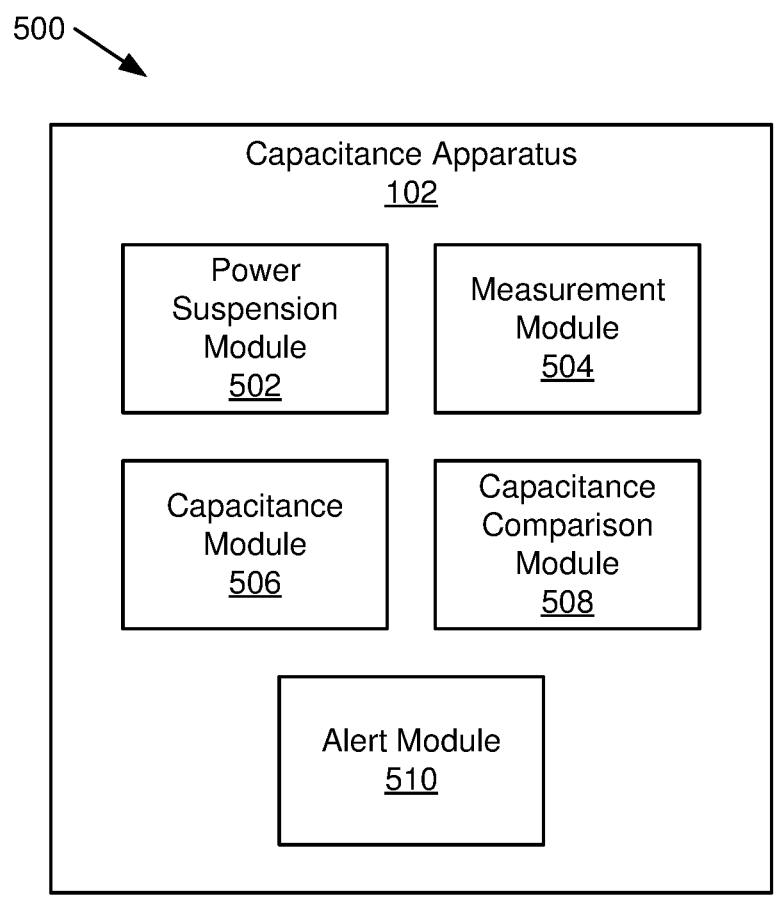
FIG. 5 is a schematic block diagram of an apparatus for measuring DC link capacitance in a power conversion system, according to various embodiments.

FIG. 5 is a schematic block diagram of an apparatus 500 for measuring DC link capacitance in a power conversion system, according to various embodiments. The apparatus 500 includes a capacitance apparatus 102 with a power suspension module 502, a measurement module 504, a capacitance module 506, a capacitance comparison module 508, and an alert module 510, which are described below. In various embodiments, all or a portion of the apparatus 500 is implemented with hardware circuits and/or a programmable hardware device. In some embodiments, all or a portion of the apparatus 500 is implemented with code stored on computer readable storage media. The computer readable storage media being non-transitory. In some examples, the controller 116 includes a processor and computer readable storage media and the apparatus 500 accesses a digitized voltage of the DC link capacitor 108 available to the controller 116 and the controller 116 is connected to a computer network for transmission of an alert and other data. One of skill in the art will recognize other ways to implement the apparatus 500.

The apparatus 500 includes a power suspension module 502 configured to suspend power flow between a DC source and a DC link capacitor 108 of a power converter 101 and to suspend power flow between the DC link capacitor 108 and a load of the power converter 101. In some embodiments, the DC source is the rectifier 106 that receives power from an AC source 104 and converts the AC power to DC power that is fed to the DC link capacitor 108. In other embodiments, the DC source is a DC power source providing power to a DC bus connected to the DC link capacitor 108. In some embodiments, the load is the inverter 112 and AC load 114. In other embodiments, the load is a DC to DC converter providing DC power to a load at a voltage different than a voltage of the DC link capacitor 108. In other embodiments, the load is a resonant converter which provides AC power to a load. In some examples, the resonant converter provides power to a wireless charging pad and a receiver pad and attached load receive power wirelessly from the wireless charging pad. One of skill in the art will recognize other loads that may be connected to a DC link capacitor 108.

The DC link capacitor 108 has a bleeding resistor 110 connected in parallel with the DC link capacitor 108. The bleeding resistor 110 is positioned to discharge the DC link capacitor 108. In some embodiments, the bleeding resistor 110 is sized to discharge the DC link capacitor 108 over a relatively long period of time, such as over a minute, a few minutes, an hour, or another chosen time period. The bleeding resistor 110 may also be sized to minimize power loss. In some embodiments, the DC link capacitor 108 includes two or more capacitors in series with a resistor across each capacitor. The bleeding resistor 110, in the embodiments, may be a series combination of the resistors across the capacitors making up the DC link capacitor 108. In other embodiments, the DC link capacitor 108 may include two or more capacitors in parallel and the bleeding resistor 110 is connected between a positive and a negative connection of the capacitors in parallel.

In other embodiments, the DC link capacitor 108 is made up of both series and parallel capacitors and the bleeding resistor 110 is a combination of resistors connected in series across the capacitors. In some embodiments, the series resistors making up the bleeding resistor 110 are arranged to provide an even voltage distribution across the capacitors making up the DC link capacitor 108. One of skill in the art will recognize various configurations of a DC link capacitor 108 with one or more resistors forming a bleeding resistor 110 connected across the DC link capacitor 108 to discharge the DC link A E capacitor 108.

The DC link capacitor 108 also has an auxiliary power supply, such as the SMPS 118, drawing power from the DC link capacitor 108. The auxiliary power supply provides control power for the power converter 101. Typically, the auxiliary power supply has a power draw much lower than the load receiving power from the DC link capacitor 108. In other embodiments, the auxiliary power supply draws a significant amount of power. In some embodiments, power drawn by the auxiliary power supply is not metered and is unknown and the apparatus 500 is able to determine a current capacitance of the DC link capacitor 108 without knowing the amount of power drawn by the auxiliary power supply.

In some embodiments, the power suspension module 502 commands semiconductor switches, an electronic switch, a relay, etc. to a state where power flow between a DC source and the DC link capacitor 108 is suspended and power flow between a load and the DC link capacitor 108 is also suspended. In various embodiments, the power suspension module 502 suspends power transfer at a time after the DC link capacitor 108 is charged. In some examples, the power suspension module 502 commands semiconductor switches, relays, etc. to be in an open state. In other embodiments, the power suspension module 502 commands another state, such as a closed state, for one or more switches associated with the DC source to stop providing power to the DC link capacitor 108 and/or to stop the load from drawing power from the DC link capacitor 108. In some embodiments, the power suspension module 502 sends a command to a controller outside the converter to suspend power from a DC source to a DC link capacitor 108 of a power converter 101 and to suspend providing power from the DC link capacitor 108 to a load of the power converter 101.

In some embodiments, the power suspension module 502 suspends power in response to a command from a user. In other embodiments, the power suspension module 502 suspends power in response to a command from a higher level control system. In some embodiments, the power suspension module 502 suspends power on a schedule, such as once a week, once a month, once a quarter, etc. In some embodiments, the power suspension module 502 suspends power during a startup operation, just before a shutdown operation, or other opportune time when not providing power to the load will not cause problems or interfere with operations and when the DC link capacitor 108 is charged. One of skill in the art will recognize other ways for the power suspension module 502 to suspend power from a DC source to a DC link capacitor 108 of a power converter 101 and to suspend providing power from the DC link capacitor 108 to a load of the power converter 101 and will recognize times for the power suspension module 502 to suspend power that will not negatively affect operations.

The apparatus 500 includes a measurement module 504 configured to measure, using a voltage sensing circuit to measure voltage across the DC link capacitor 108, a first voltage at a first time, a second voltage at a second time, and a third voltage at a third time in response to the power suspension module 502 suspending power from or to the DC source and power to or from the load. The first time is a time after the power suspension module 502 suspends power from the DC source and power to the load. In some embodiments, the second time and the third time are at predetermined times after the first time.

In some embodiments, the second time and third time are selected to allow a selected amount of discharge of the DC link capacitor 108. In some embodiments, the second time and third time, relative to the first time, are selected based on a time constant of an initial capacitance of the DC link capacitor 108 multiplied by a resistance of the bleeding resistor 110 (e.g., RC). The time constant may be used to determine an expected amount of time to discharge the DC link capacitor 108 a chosen percentage, such as 20 percent, 30 percent, 50%, etc. The second time and the third time may then be selected based on a particular amount of expected discharge of the DC link capacitor 108 using the time constant. In some embodiments, the measurement times are short enough so that power drawn by the auxiliary power supply, such as SMPS 118, is constant or nearly constant.

In some embodiments, a time difference between the first time and the second time (e.g., $\Delta t_1$) is equal to a time difference between the second time and the third time (e.g., $\Delta t_2$) such that $\Delta t_1 = \Delta t_2 = \Delta t$. Having an equal amount time between the times that voltage is measured across the DC link capacitor 108 allows use of equations 12(b) and 21(b) in determining a current capacitance of the DC link capacitor 108. In some embodiments, the measurement module 504 stores the first, second, and third voltages and the first, second, and third times for use in determining a current capacitance of the DC link capacitor 108.

In some embodiments, the measurement module 504 includes a voltage sensing circuit configured to measure voltage across the DC link capacitor 108. In some embodiments, the voltage sensing circuit includes conductors connected to an analog-to-digital converter and voltage of the DC link capacitor 108 is digitized for use by the apparatus 500. In other embodiments, the voltage sensing circuit includes an optocoupler or other isolation device to enable measurement of the voltage of the DC link capacitor 108 for the controller 116 with a different reference than a negative terminal or bus connected to the DC link capacitor 108. In other embodiments, the voltage sensing circuit includes resistors in a voltage divider, a hall-effect sensor, a snubber, or other circuits to condition a voltage signal from conductors connected across the DC link capacitor 108. One of skill in the art will recognize other ways for the measurement module 504 to use the voltage sensing circuit to measure voltage across the DC link capacitor 108 to provide a signal to the measurement module 504 representative of voltage across the DC link capacitor 108.

The apparatus 500 includes a capacitance module 506 configured to use a resistance of the bleeding resistor 110, the first, second and third voltages and the first, second and third times to determine a current capacitance of the DC link capacitor 108. In some embodiments, the capacitance module 506 uses equation 7(b), 12(b), or 21(b) to determine the current capacitance of the DC link capacitor 108. In other embodiments, the power converter 101 includes a different topology, such as a different configuration of the DC link capacitor 108 and/or bleeding resistor 110 and an equivalent circuit is developed for a condition when the DC link capacitor 108 is not receiving power from or sending power to a DC source and not providing power to or receiving power from a load and the equivalent circuit is used to derive equations for a 3-point method similar to equations 1-21 are derived and then used by the capacitance module 506 to determine the current capacitance of the DC link capacitor 108.

The apparatus 500 includes a capacitance comparison module 508 configured to compare the current capacitance determined by the capacitance module 506 with an initial capacitance or a chosen reference capacitance of the DC link capacitor 108 and an alert module 510 configured to send an alert in response to determining that a difference between the current capacitance and the initial capacitance is above a capacitance degradation threshold. In some embodiments, the initial capacitance of the DC link capacitor 108 is a rated value provided by the manufacturer of the DC link capacitor 108. In other embodiments, the initial capacitance of the DC link capacitor 108 is a measured value that is measured when the power converter 101 and/or DC link capacitor 108 are manufactured, new, or recently replaced. In some examples, the capacitance apparatus 102 is used to determine the initial capacitance of the DC link capacitor 108. In other embodiments, the initial capacitance of the DC link capacitor 108 is a value calculated from a group of capacitors making up the DC link capacitor 108.

In some embodiments, the capacitance degradation threshold is chosen based on an amount of capacitance degradation deemed to be unacceptable. For example, capacitance degradation of the DC link capacitor 108 of more than 30% may be deemed to be an amount that would likely cause failure of the power converter 101 and the capacitance degradation threshold may be set below 30%, such as 15% or other amount considering the manufacturing tolerance and a safe margin.

In other embodiments, the alert module 510 is configured with multiple capacitance degradation thresholds and sends an alert where the difference between the current capacitance of the DC link capacitor 108 and the initial capacitance is above one of the capacitance degradation thresholds. In some examples, each alert corresponds to degradation levels, such as a first warning level, a second warning level, a failure level, etc. In other examples, the alert module 510 calculates a life consumed or a residual life of the DC link capacitor 108 based on an aging curve, and sends alerts based on predefined thresholds of consumed life or residual life. One of skill in the art will recognize appropriate differences between a current capacitance and an initial capacitance of the DC link capacitor 108.

In some embodiments, the alert module 510 transmits an alert with a current capacitance of the DC link capacitor 108. In other embodiments, the alert module 510 transmits an alert with an amount of degradation of the DC link capacitor 108. In some embodiments, the alert module 510 sends the alert to a user, such as a person responsible for maintaining the power converter 101. In some embodiments, the alert module 510 sends the alert over a control bus. In other embodiments, the alert module 510 sends the alert in the form of an email. One of skill in the art will recognize other alerts and alert contents and ways to transmit the alert.

Beneficially, the apparatus 500 provides a way to determine a current capacitance of the DC link capacitor 108 using a 3-point method and to determine if the current capacitance is far enough from an initial capacitance of the DC link capacitor 108 to be of concern. The apparatus 500, using three voltages of the DC link capacitor 108 at three different times is able to determine the current capacitance of the DC link capacitor 108 while the DC link capacitor 108 is connected to the power converter 101 and without knowing an amount of power drawn by an auxiliary power supply.

Figure 6:
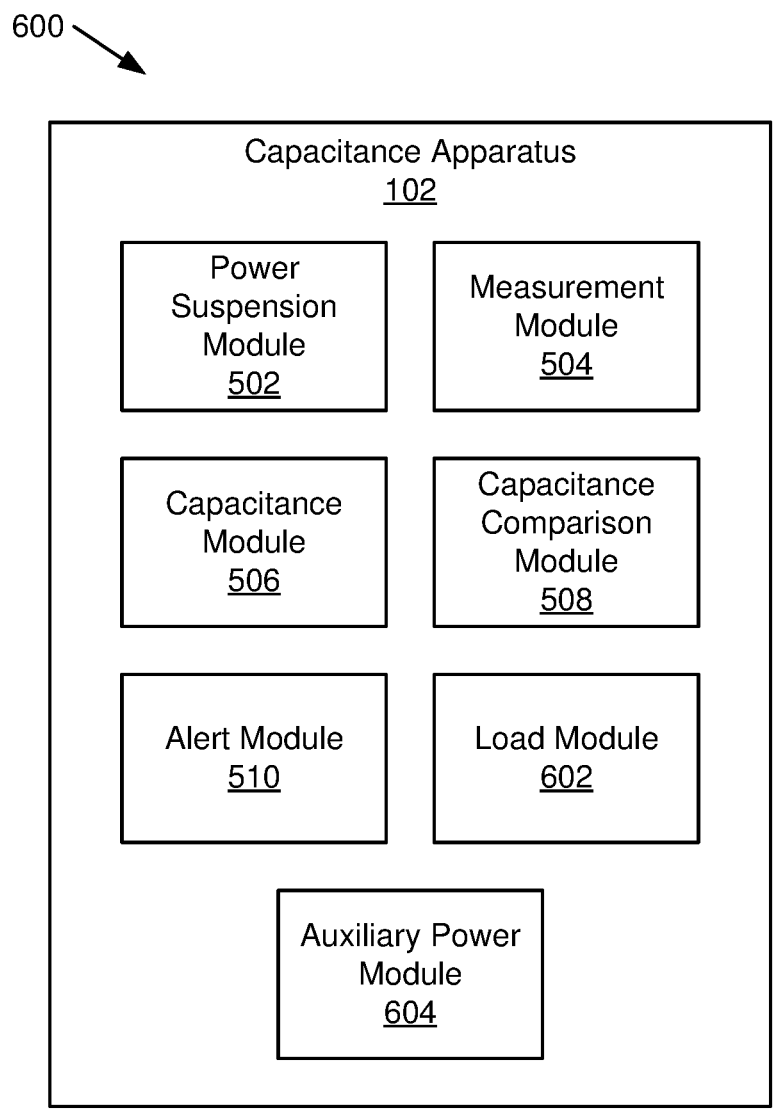
FIG. 6 is a schematic block diagram of another apparatus for measuring DC link capacitance in a power conversion system, according to various embodiments.

FIG. 6 is a schematic block diagram of another apparatus 600 for measuring DC link capacitance in a power conversion system, according to various embodiments. The apparatus 600 includes a capacitance apparatus 102 with a power suspension module 502, a measurement module 504, a capacitance module 506, a capacitance comparison module 508, and an alert module 510 that are substantially similar to those described above in relation to the apparatus 500 of FIG. 5. In various embodiments, the apparatus 600 includes a load module 602, an auxiliary power module 604, and/or a restart module 606, which are described below. The apparatus 600, in various embodiments, is implemented similar to the apparatus 500 of FIG. 5.

The apparatus 600 includes, in some embodiments, a load module 602 configured to determine that the load is not drawing power and is not providing power to the DC link capacitor 108 in response to the power suspension module 502 suspending power flow between the DC source and the DC link capacitor 108 and suspending power flow between the load and the DC link capacitor 108. In some instances, the power suspension module 502 sending commands to gate drives 124, switches, etc. to stop the rectifier 106 from supplying power to or receiving power from the DC link capacitor 108 and to stop the load, such as the inverter 112, a resonant converter, or the like, from drawing power from or providing power to the DC link capacitor 108 is insufficient to instantaneously stop power to and from the DC link capacitor 108.

In some embodiments, the inverter 112 and/or power converter 101 may be bidirectional and may be driving an AC load 114 capable of providing power to the inverter 112, such as a motor in regenerative mode. Where a motor is in regenerative mode, the motor provides power to the inverter 112, which provides power to the DC link capacitor 108. The load module 602, in some embodiments, monitors current and/or voltage at an interface between the DC link capacitor 108 and load, such as the inverter 112, or at another similar location to determine whether or not the load is providing power to or receiving power from the DC link capacitor 108.

In other embodiments, the load module 602 also determines whether the rectifier 106 is providing power to DC link capacitor 108 in response to the power suspension module 502 suspending power flow between the DC source and the DC link capacitor 108 and suspending power flow between the load and the DC link capacitor 108. In some embodiments, the rectifier 106 may consist of active semiconductor devices capable of regenerating power back to the AC source 104. In the embodiments, the load module 602 also determines whether the rectifier 106 is sending power back to the AC source from the DC link capacitors in response to the power suspension module 502 suspends power flow through the rectifier 106 and the inverter 112. In some embodiments, the rectifier 106 may include one or more capacitors, inductors, etc. that may continue to provide power to the DC link capacitor 108 for a time.

In some embodiments, the load module 602 reads signals from voltage and/or current sensors 120 to determine that the load is not drawing or providing power to the DC link capacitor 108 and the DC source is not providing power to the DC link capacitor 108 or vice versa. In some embodiments, the measurement module 504 measures the first voltage, the second voltage, and/or the third voltage in response to the load module 602 determining that the load is not drawing power and the DC source is not providing power to the DC link capacitor 108. In some embodiments, the load module 602 determines that the load is not drawing power and is not providing power to the DC link capacitor 108 prior to the measurement module 504 determining each of the first voltage, the second voltage, and the third voltage. In other embodiments, the load module 602 determines that the DC source is not providing power to or drawing power from the DC link capacitor 108 prior to the measurement module 504 determining each of the first voltage, the second voltage, and the third voltage. The load module 602 determining that the load is not drawing power and is not providing power to the DC link capacitor 108 provides further assurance that the DC link capacitor 108 is not affected by the load and/or DC source before the measurement module 504 measures voltages.

The apparatus 600 includes, in some embodiments, an auxiliary power module 604 configured to calculate the power drawn by the auxiliary power supply, such as the SMPS 118. In some embodiments, the auxiliary power module 604 calculates power drawn by the auxiliary power supply using the first voltage, the second voltage, the third voltage, and resistance of the bleeding resistor 110. In some embodiments, the auxiliary power module 604 calculates power drawn by the auxiliary power supply using equation 22:

$$P = \frac{V_2^4 - V_1^2 V_3^2}{\left(V_1^2 - 2V_2^2 + V_3^2\right)R} \quad (22)$$

The auxiliary power module 604 using the first voltage, the second voltage, the third voltage, and resistance of the bleeding resistor 110 to calculate power drawn by the auxiliary power supply is advantageous because the auxiliary power module 604 does not need any sensors or additional equipment to determine power drawn by the auxiliary power supply.

Figure 7:
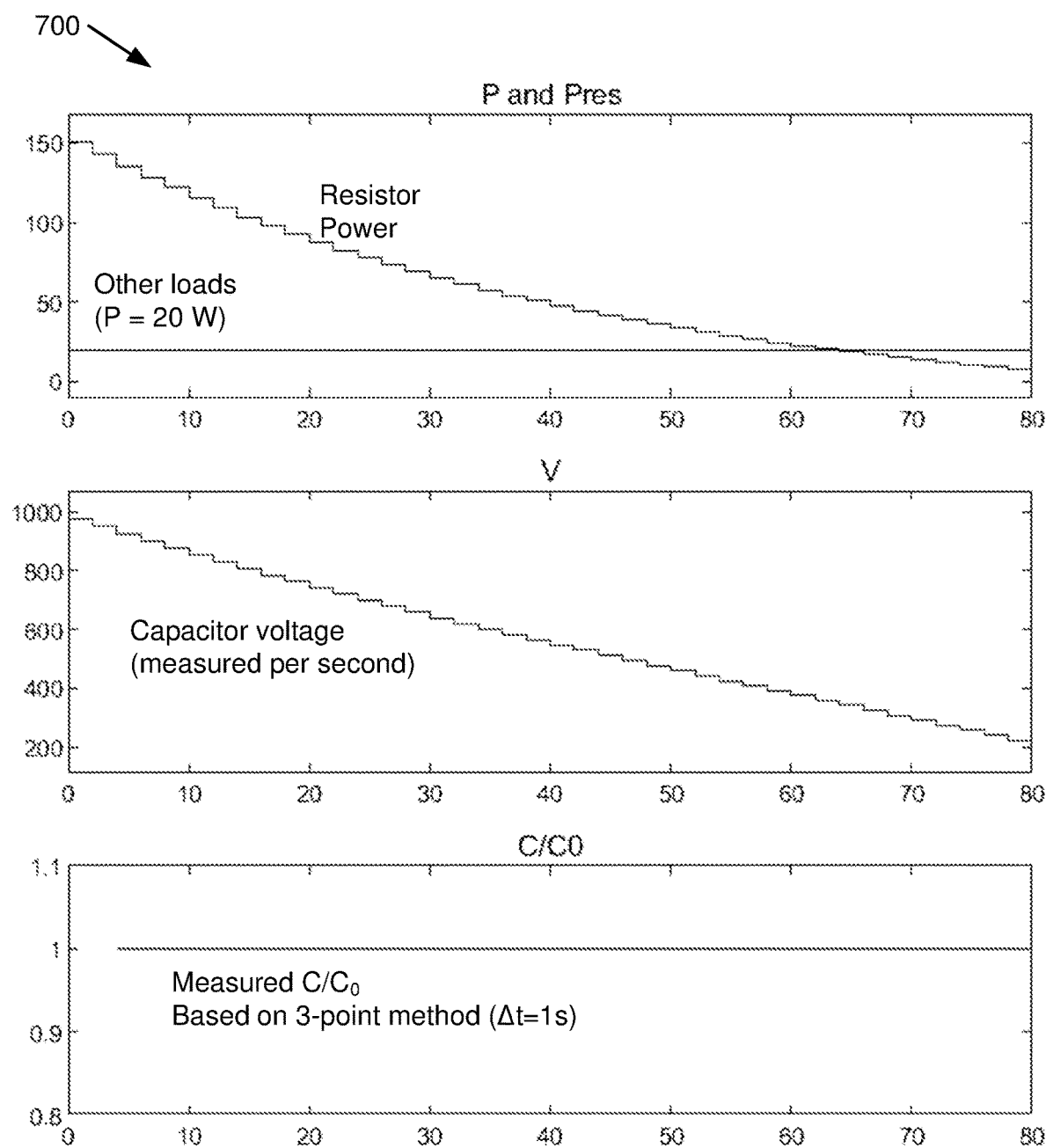
FIG. 7 includes simulation results indicating bleeding resistor power, capacitor voltage and a ratio of measured DC link capacitance and initial DC link capacitance for a condition of auxiliary power at 20 watts with no ripple, according to various embodiments.

FIG. 7 includes simulation results 700 indicating bleeding resistor power, capacitor voltage and a ratio of measured DC link capacitance and initial DC link capacitance for a condition of auxiliary power at 20 watts with no ripple, according to various embodiments. The simulation results are based on the equivalent circuit of FIG. 2. The top graph of FIG. 7 depicts power on the horizontal axis and time on the vertical axis. The top graph includes the "other loads" at 20 W. The other loads are loads other than the bleeding resistor 110, such as the power drawn by the auxiliary power supply (e.g., SMPS 118). In addition, power of the bleeding resistor 110, which is labeled "resistor power," decays to near zero over about 80 seconds. The power of the bleeding resistor 110 is a digitized signal that is sampled at 2 second intervals.

The middle graph has a vertical axis of volts and depicts voltage of the DC link capacitor 108 and is labeled "capacitor voltage." Again, the voltage of the DC link capacitor 108 is digitized and sampled at 2 second intervals. The bottom graph is a ratio of measured current capacitance of the DC link capacitor 108 and the initial actual capacitance of the DC link capacitor 108 e.g., $C/C_0$. The current capacitance of the DC link capacitor 108 is determined using equation 7(b) based on three voltage measurements across the DC link capacitor 108 at three different times where the 3-point method is calculated at numerous times between about 3 seconds and 80 seconds. Measurement and calculation are continuously executed using 3-point method throughout the whole 80 second window starting. Note that the ratio $C/C_0$ is flat indicating the measured capacitance is the same as actual capacitance and no error due to the 20 W of power drawn by the other loads.

Figure 8:
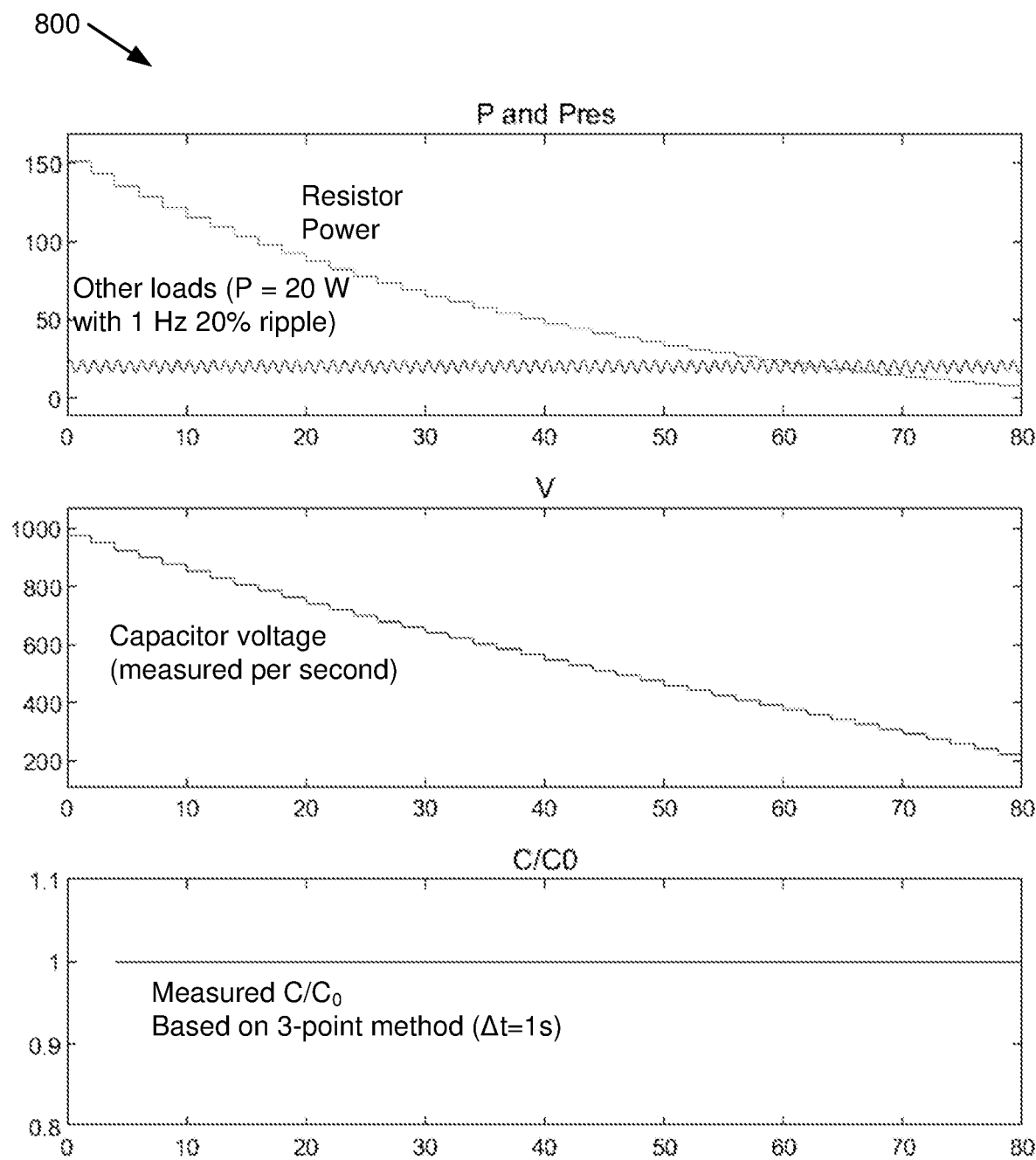
FIG. 8 includes simulation results indicating bleeding resistor power, capacitor voltage and a ratio of measured DC link capacitance and initial DC link capacitance for a condition of auxiliary power at 20 watts with a 1 hertz 20 percent ripple, according to various embodiments.

FIG. 8 includes simulation results 800 indicating bleeding resistor power, capacitor voltage and a ratio of measured DC link capacitance and initial DC link capacitance for a condition of auxiliary power at 20 watts with a 1 hertz 20 percent ripple, according to various embodiments. The simulation results are based on calculation of the current capacitance using the 3-point method and using the averaged voltage equation of 21(b). Again, the top graph depicts resistor power of the bleeding resistor 110 and power drawn by "other loads." The power drawn by other loads is again 20 W as in FIG. 7, but the power drawn by other loads includes a 1 hertz ("Hz") ripple with an amplitude of 20% of the 20 W. Again, the middle graph depicts voltage across the DC link capacitor 108 and the bottom graph depicts the ratio $C/C_0$, which is again flat. Simulation results using equations 7(b), 12(b) and 21(b) reveal that the current capacitance is most accurate using the 3-point method and the average voltage equation 21(b). Thus, where there is a ripple on the power drawn by the auxiliary power supply or other loads different than the bleeding resistor 110, equation 21(b) may provide more accurate results in determining a current capacitance of the DC link capacitor 108.

Figure 9:
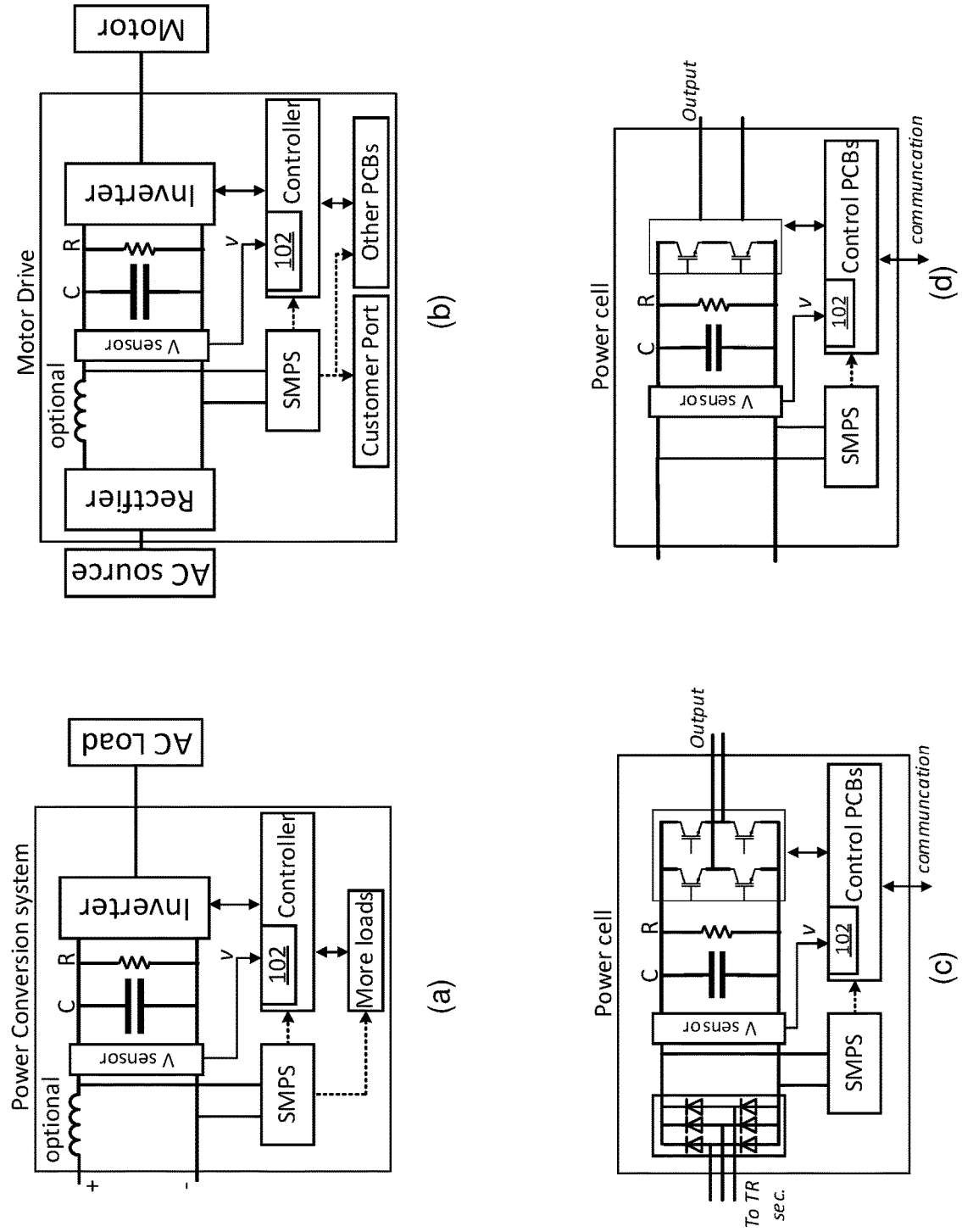
FIG. 9 is a schematic block diagram of possible converter use cases, each with an apparatus for measuring DC link capacitance in a power conversion system, according to various embodiments.

FIG. 9 is a schematic block diagram 900 of possible converter use cases, each with a capacitance apparatus 102 for measuring DC link capacitance in a power conversion system, according to various embodiments. Each of the converter systems of FIG. 9 may include a capacitance apparatus 102 to determine degradation of a DC link capacitor. FIG. 9(a) depicts a power conversion system with a converter similar to the power converter 101 of FIG. 1 without a rectifier 106. The converter of FIG. 9(a) may be used with a DC power source feeding the input terminals on the left. The power conversion system may be used to convert DC power to AC power.

The second converter in FIG. 9(b) depicts a motor drive with a power converter 101 as depicted in FIG. 1 where the AC load is a motor. The third converter in FIG. 9(c) is a power cell of a cascaded H-bridge ("CHB") with an input connected to a three-phase transformer secondary. The rectifier is a full-bridge rectifier with diodes and the load is an inverter with semiconductor switches in an H-bridge configuration. The power cell may be used to convert an AC voltage at one frequency to an AC voltage at another frequency. The fourth converter in FIG. 9(d) is a power cell of a modular multilevel converter ("MMC") system. Each of the converters of FIG. 9 may be used with the capacitance apparatus 102.

Figure 10:
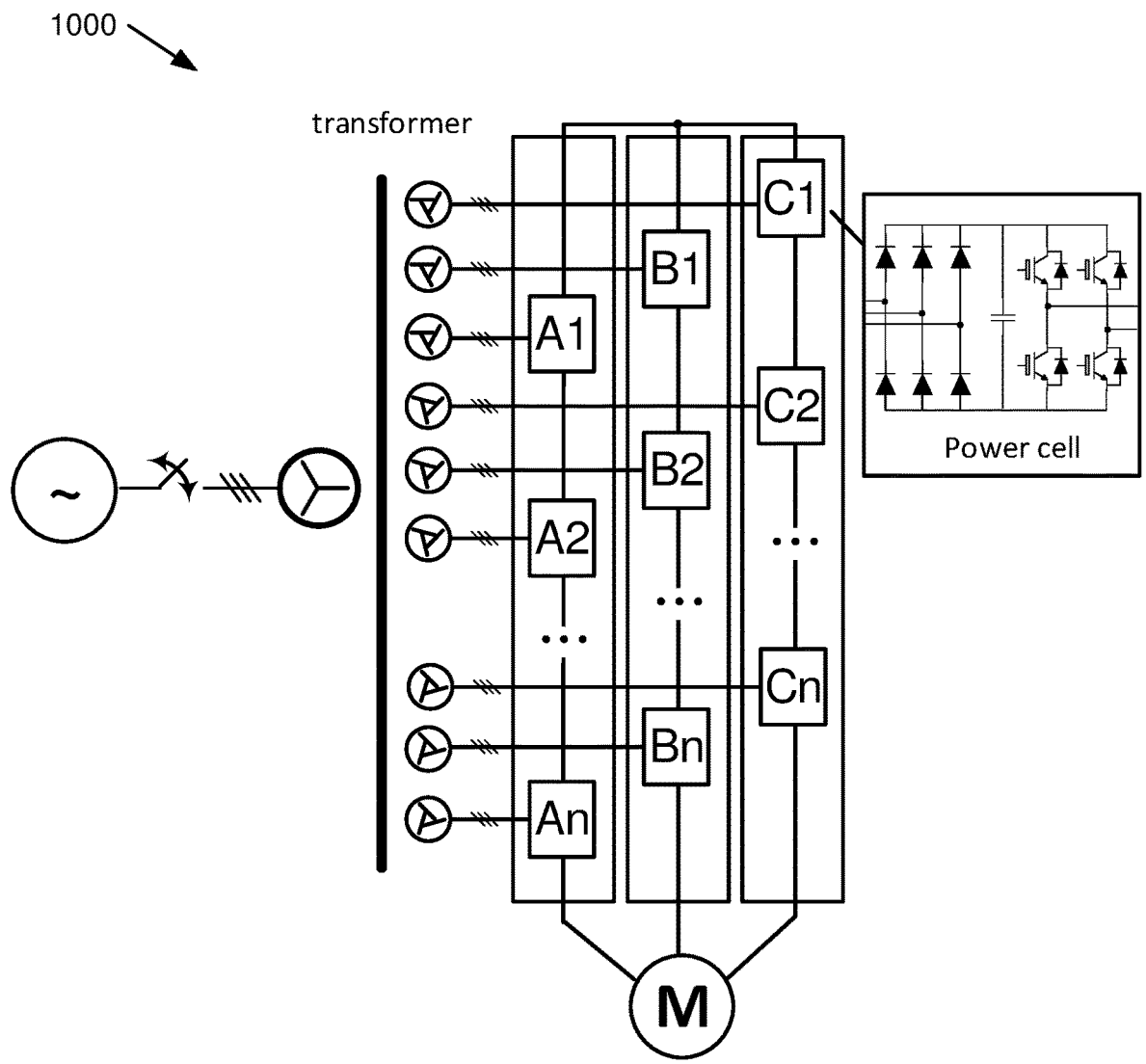
FIG. 10 is a schematic block diagram of a possible medium voltage converter use case with an apparatus for measuring DC link capacitance in a power conversion system, according to various embodiments.

FIG. 10 is a schematic block diagram 1000 of a possible medium voltage CHB converter use case corresponding to the power cell shown in FIG. 9(c) with a capacitance apparatus 102 for measuring DC link capacitance in a power conversion system, according to various embodiments. The system of FIG. 10 includes a three-phase power source on the left that connects to a three-phase wye-delta transformer with multiple secondary windings. Each secondary winding is connected to a power cell depicted as A1-An, B1-Bn, and C1-Cn. The A1-An power cells are for a first phase, the B1-Bn power cells are connected to a second phase, and the C1-Cn power cells are connected to a third phase. The power cells A1-An, B1-Bn, C1-Cn are series connected for each phase to increase voltage to a motor at the bottom (circle with an "M"). Each power cell is configured with a full-bridge rectifier connected to input terminals and to an inverter with semiconductor switches in an H-bridge configuration, which forms the output to be series connected to the load. Note that the strings of power cells are connected together at the top forming a wye configuration. Each power cell may include the capacitance apparatus 102, as shown in FIG. 9(c).

Figure 11:
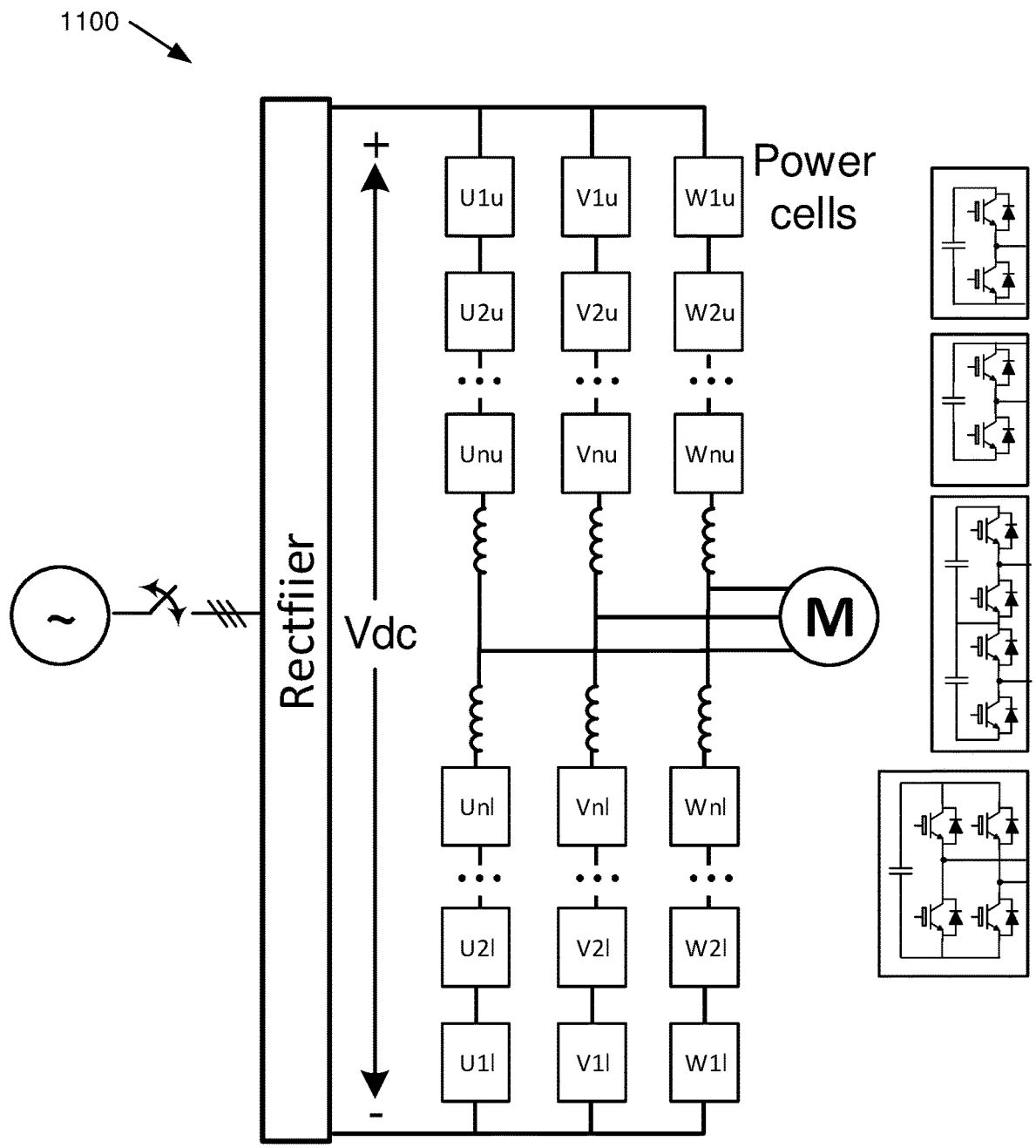
FIG. 11 is a schematic block diagram of another possible medium voltage converter use case with an apparatus for measuring DC link capacitance in a power conversion system, according to various embodiments.

FIG. 11 is a schematic block diagram 1100 of another possible medium voltage MMC converter use case corresponding to the power cell shown in FIG. 9(d) with an apparatus 102 for measuring DC link capacitance, according to various embodiments. The system depicted in FIG. 11 includes a three-phase AC power source connected to a common rectifier. The rectifier provides a DC bus for connection to strings of power cells stacked in series for each of three phases feeding a motor. Some power cells (e.g., U1u-Unu, V1u-Vnu, W1u-Wnu) are above a mid-point connection point of each phase and an equal number of power cells (e.g., U1l-Unl, V1l-Vnl, W1l-Wnl) are connected below the mid-point connection of each phase. The right side of FIG. 11 depicts different possible configurations of power cells, where each power cell may include a capacitance apparatus 102, as exemplarily depicted in FIG. 9(d).

Figure 12:
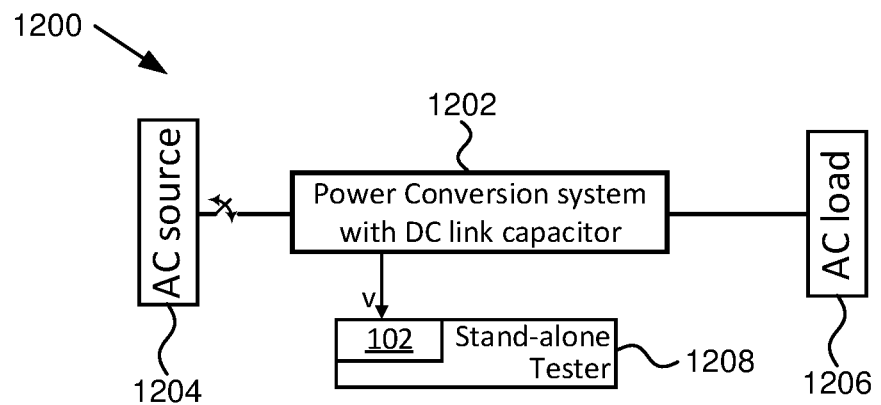
FIG. 12 is a schematic block diagram of a system for measuring DC link capacitance in a power conversion system with an external measurement device, according to various embodiments.

FIG. 12 is a schematic block diagram 1200 of a system for measuring DC link capacitance in a power conversion system with an external measurement device, according to various embodiments. A power conversion system 1202 is depicted in FIG. 12 and is fed by an AC source 1204 and feeds an AC load 1206. A capacitance apparatus 102 is included in a stand-alone tester 1208, which maybe brought in to test capacitance of a DC link capacitor 108 of the power conversion system 1202. The power conversion system 1202 may be any power conversion system with a DC link capacitor 108.

Figure 13:
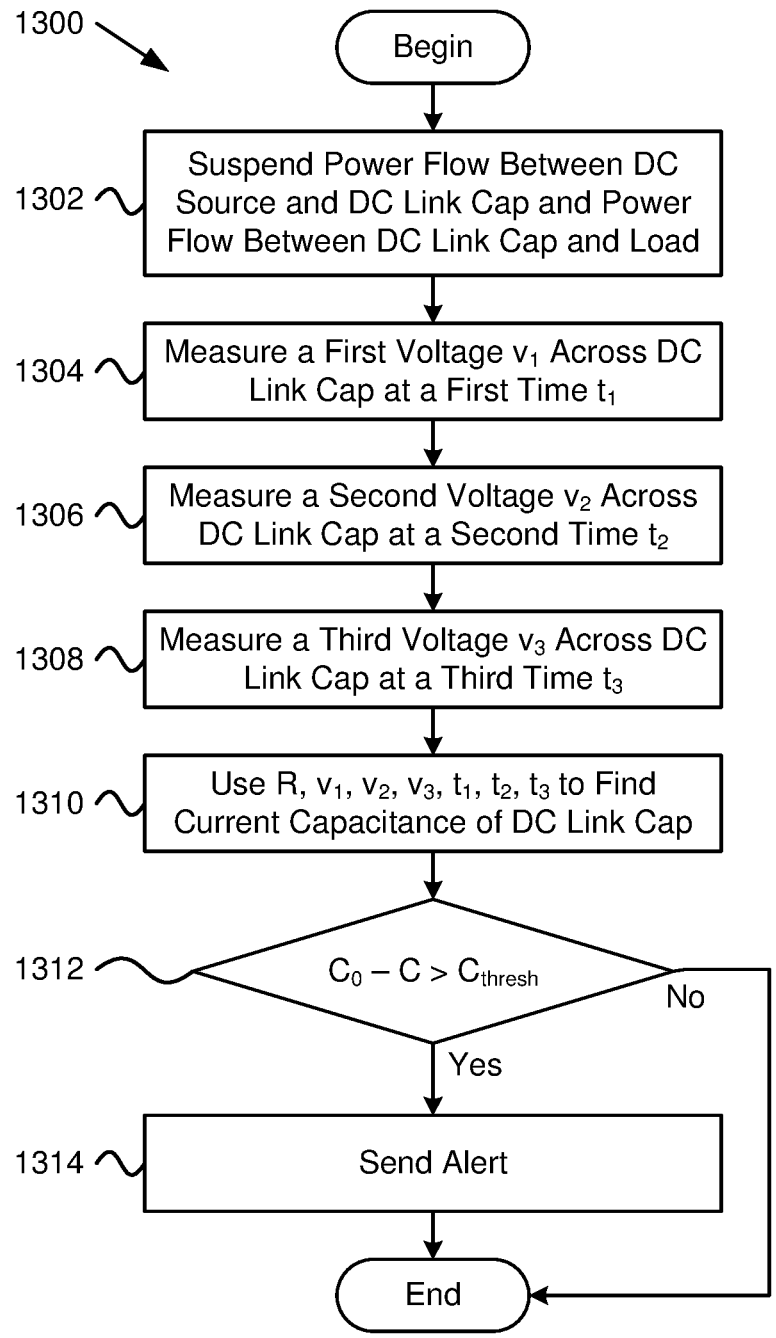
FIG. 13 is a schematic flow chart diagram illustrating a method for measuring DC link capacitance in a power conversion system, according to various embodiments.

FIG. 13 is a schematic flow chart diagram illustrating a method 1300 for measuring DC link capacitance in a power conversion system, according to various embodiments. The method 1300 begins and suspends 1302 providing DC power from a DC source, such as an AC source 104 feeding a rectifier 106, to a DC link capacitor 108 of a power converter 101 and suspends 1302 providing power from the DC link capacitor 108 to a load of the power converter 101, such as the inverter 112 and AC load 114. The DC link capacitor 108 includes a bleeding resistor 110 connected in parallel with the DC link capacitor 108. and an auxiliary power supply (e.g., SMPS 118) drawing power from the DC link capacitor 108. The auxiliary power supply provides control power for the power converter 101.

The method 1300 measures 1304 a first voltage $v_1$ across the DC link capacitor 108 at a first time $t_1$, and then measures 1306 a second voltage $v_2$ across the DC link capacitor 108 at a second time $t_2$, and then measures 1308 a third voltage $v_3$ across the DC link capacitor 108 at a first time $t_3$. The method 1300 uses 1310 resistance R of a bleeding resistor 110, the first voltage $v_1$, the second voltage $v_2$, the third voltage $v_3$, the first time $t_1$, the second time $t_2$, and the third time $t_3$ to calculate a current capacitance C of the DC link capacitor 108. The method 1300 determines 1312 if a difference between the current capacitance C and an initial capacitance $C_0$ of the DC link capacitor 108 is above a capacitance degradation threshold $C_{thresh}$.

If the method 1300 determines 1312 that the difference between the current capacitance C and the initial capacitance $C_0$ of the DC link capacitor 108 is above a capacitance degradation threshold $C_{thresh}$, the method 1300 sends 1314 and alert, and the method 1300 ends. If the method 1300 determines 1312 that the difference between the current capacitance C and the initial capacitance $C_0$ of the DC link capacitor 108 is not above a capacitance degradation threshold $C_{thresh}$, no alert is sent and the method 1300 ends. In various embodiments, all or a portion of the method 1300 is implemented using the power suspension module 502, the measurement module 504, the capacitance module 506, the capacitance comparison module 508, the alert module 510, and/or the restart module 606.

Figure 14:
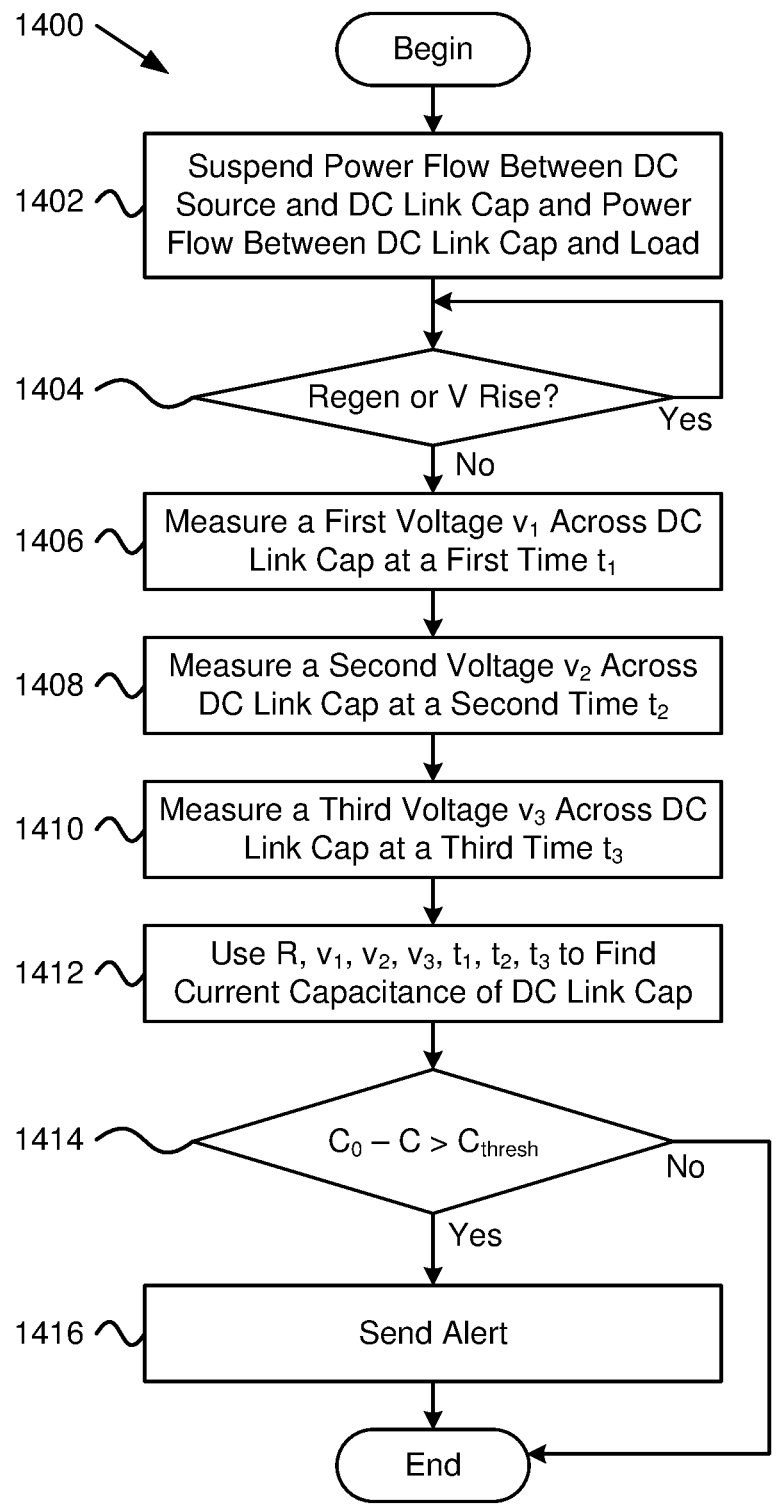
FIG. 14 is a schematic flow chart diagram illustrating an alternate method for measuring DC link capacitance in a power conversion system, according to various embodiments.

FIG. 14 is a schematic flow chart diagram illustrating an alternate method 1400 for measuring DC link capacitance in a power conversion system, according to various embodiments. The method 1400 begins and suspends 1402 providing DC power from a DC source, such as an AC source 104 feeding a rectifier 106, to a DC link capacitor 108 of a power converter 101 and suspend 1402 providing power from the DC link capacitor 108 to a load of the power converter 101, such as the inverter 112 and AC load 114. The DC link capacitor 108 includes a bleeding resistor 110 connected in parallel with the DC link capacitor 108. and an auxiliary power supply (e.g., SMPS 118) drawing power from the DC link capacitor 108. The auxiliary power supply provides control power for the power converter 101.

The method 1400 determines 1404 if power is being supplied to the DC link capacitor 108, such as by regenerative braking of a motor. In some embodiments, the method 1400 determines 1404 if power is being supplied to the DC link capacitor 108 by measuring current from the load or by determining that voltage on the DC link capacitor 108 is rising. If the method 1400 determines 1404 that power is being supplied to the DC link capacitor 108, the method 1400 returns and continues to determine 1404 if power is being supplied to the DC link capacitor 108.

If the method 1400 determines 1404 that power is not being supplied to the DC link capacitor 108, the method 1400 measures 1406 a first voltage $v_1$ across the DC link capacitor 108 at a first time $t_1$, and then measures 1408 a second voltage $v_2$ across the DC link capacitor 108 at a second time $t_2$, and then measures 1410 a third voltage $v_3$ across the DC link capacitor 108 at a first time $t_3$. The method 1400 uses 1412 resistance R of a bleeding resistor 110, the first voltage $v_1$, the second voltage $v_2$, the third voltage $v_3$, the first time $t_1$, the second time $t_2$, and the third time $t_3$ to calculate a current capacitance C of the DC link capacitor 108. The method 1400 determines 1414 if a difference between the current capacitance C and an initial capacitance $C_0$ of the DC link capacitor 108 is above a capacitance degradation threshold $C_{thresh}$.

If the method 1400 determines 1414 that the difference between the current capacitance C and the initial capacitance $C_0$ of the DC link capacitor 108 is above a capacitance degradation threshold $C_{thresh}$, the method 1400 sends 1416 and alert, and the method 1400 ends. If the method 1400 determines 1414 that the difference between the current capacitance C and the initial capacitance $C_0$ of the DC link capacitor 108 is not above the capacitance degradation threshold $C_{thresh}$, no alert is sent and the method 1400 ends. In various embodiments, all or a portion of the method 1400 is implemented using the power suspension module 502, the measurement module 504, the capacitance module 506, the capacitance comparison module 508, the alert module 510, and/or the load module 602.

Figure 15A:
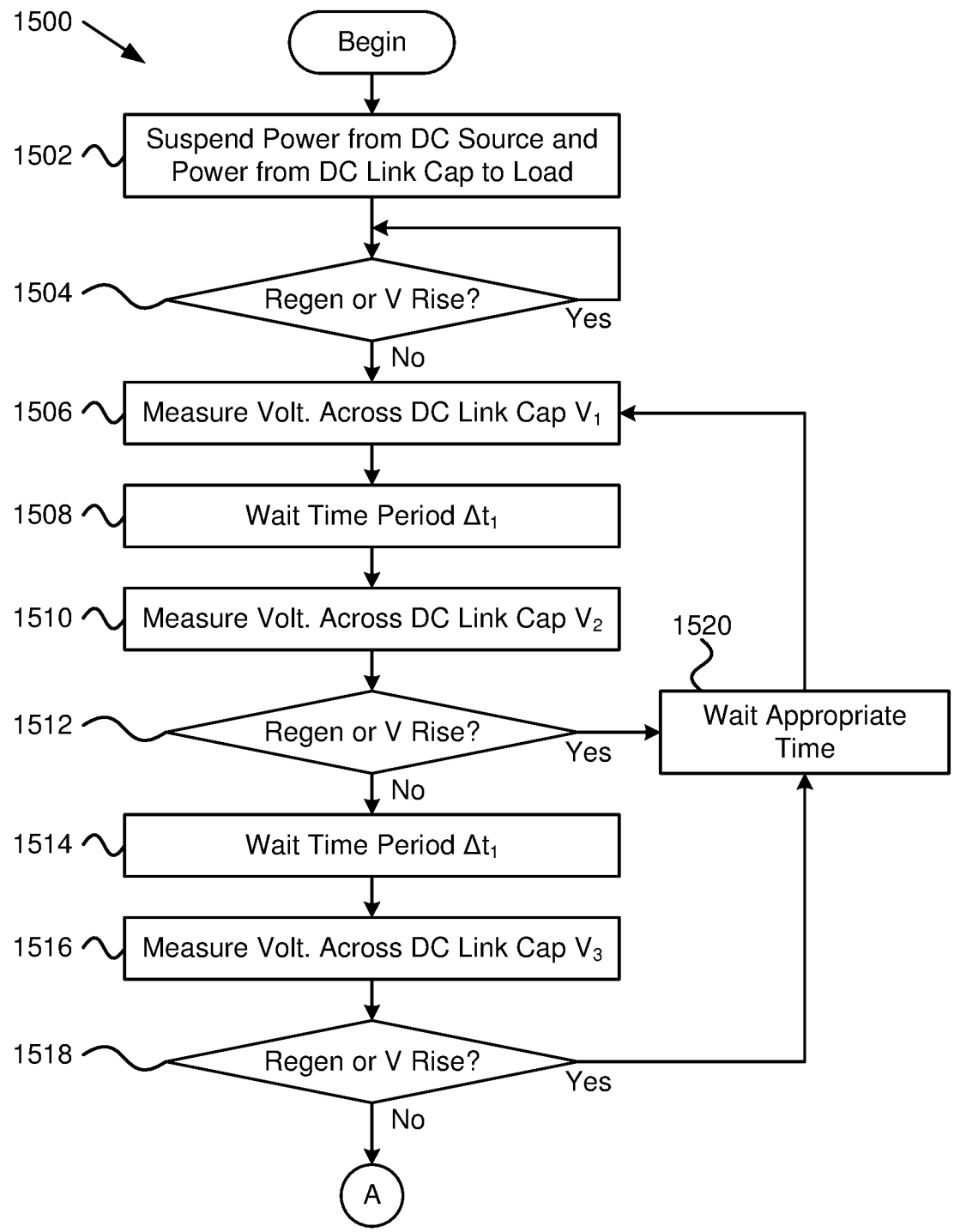
FIG. 15A is a first part of a schematic flow chart diagram illustrating another method for measuring DC link capacitance in a power conversion system, according to various embodiments.
Figure 15B:
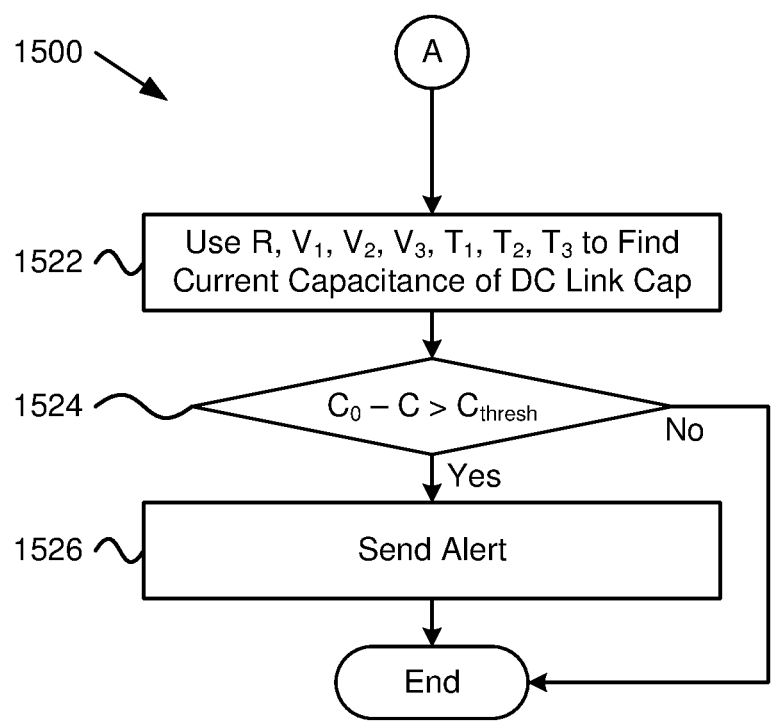
FIG. 15B is a second part of the schematic flow chart diagram of FIG. 15A, according to various embodiments.

FIG. 15A is a first part and FIG. 15B is a second part of a schematic flow chart diagram illustrating another method 1500 for measuring DC link capacitance in a power conversion system, according to various embodiments. The method 1500 includes measuring voltages at a uniform rate. The method 1500 begins and suspends 1502 providing DC power from a DC source, such as an AC source 104 feeding a rectifier 106, to a DC link capacitor 108 of a power converter 101 and suspends 1502 providing power from the DC link capacitor 108 to a load of the power converter 101, such as the inverter 112 and AC load 114. The DC link capacitor 108 includes a bleeding resistor 110 connected in parallel with the DC link capacitor 108. and an auxiliary power supply (e.g., SMPS 118) drawing power from the DC link capacitor 108. The auxiliary power supply provides control power for the power converter 101.

The method 1500 determines 1504 if power is being supplied to the DC link capacitor 108, such as by regenerative braking of a motor. In some embodiments, the method 1500 determines 1504 if power is being supplied to the DC link capacitor 108 by measuring current from the load or by determining that voltage on the DC link capacitor 108 is rising. If the method 1500 determines 1504 that power is being supplied to the DC link capacitor 108, the method 1500 returns and continues to determine 1504 if power is being supplied to the DC link capacitor 108.

If the method 1500 determines 1504 that power is not being supplied to the DC link capacitor 108, the method 1500 measures 1506 a first voltage $v_1$ across the DC link capacitor 108 at a first time $t_1$, and then waits 1508 a first time period $\Delta t_1$ and measures a second voltage $v_2$ across the DC link capacitor 108 at a second time $t_2$. The method 1500 determines 1512 if power is being supplied to the DC link capacitor 108, such as by regenerative braking of a motor. If the method 1500 determines 1512 that power is not being supplied to the DC link capacitor 108, the method 1500 waits 1514 a second time period $\Delta t_2$ and measures 1516 a third voltage $v_3$ across the DC link capacitor 108 at a third time $t_3$. The method 1500 again determines 1518 if power is being supplied to the DC link capacitor 108, such as by regenerative braking of a motor. If the method 1500 determines 1512, 1518 that power is being supplied to the DC link capacitor 108, the method 1500 waits 1520 an appropriate time period and returns and again measures 1506 a first voltage $v_1$ across the DC link capacitor 108.

The method 1500 uses 1522 (follow "A" on FIG. 15A to "A" on FIG. 15B) resistance R of a bleeding resistor 110, the first voltage $v_1$, the second voltage $v_2$, the third voltage $v_3$, the first time $t_1$, the second time $t_2$, and the third time $t_3$ to calculate a current capacitance C of the DC link capacitor 108. The method 1500 determines 1524 if a difference between the current capacitance C and an initial capacitance $C_0$ of the DC link capacitor 108 is above a capacitance degradation threshold $C_{thresh}$.

If the method 1500 determines 1524 that the difference between the current capacitance C and the initial capacitance $C_0$ of the DC link capacitor 108 is above a capacitance degradation threshold $C_{thresh}$, the method 1500 sends 1526 and alert, and the method 1500 ends. If the method 1500 determines 1524 that the difference between the current capacitance C and the initial capacitance $C_0$ of the DC link capacitor 108 is not above a capacitance degradation threshold $C_{thresh}$, no alert is sent and the method 1500 ends. In various embodiments, all or a portion of the method 1500 is implemented using the power suspension module 502, the measurement module 504, the capacitance module 506, the capacitance comparison module 508, the alert module 510, the load module 602, and/or the restart module 606.

This description uses examples to disclose the invention and also to enable any person skilled in the art to practice the invention, including making and using any devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A component comprising:
  a power suspension module configured to suspend power flow between a direct current ("DC") source and a DC link capacitor of a power converter and to suspend power flow between the DC link capacitor and a load of the power converter, a bleeding resistor is connected in parallel with the DC link capacitor and an auxiliary power supply draws power from the DC link capacitor, the auxiliary power supply providing control power for the power converter;
  a measurement module configured to measure, using a voltage sensing circuit to measure voltage across the DC link capacitor, a first voltage at a first time, a second voltage at a second time, and a third voltage at a third time in response to the power suspension module suspending power from or to the DC source and power to or from the load;
  a capacitance module configured to use a resistance of the bleeding resistor, the first, second and third voltages and the first, second and third times to determine a current capacitance of the DC link capacitor;
  a capacitance comparison module configured to compare the current capacitance with an initial capacitance of the DC link capacitor; and
  an alert module configured to send an alert in response to determining that a difference between the current capacitance and the initial capacitance is above a capacitance degradation threshold,
  wherein at least a portion of said modules comprise hardware circuits, a programmable hardware device, and/or executable code, the executable code stored on one or more non-transitory computer readable storage media.

2. The component of claim 1, wherein the capacitance module determines the current capacitance without measuring or knowing an amount of power drawn by the auxiliary power supply.

3. The component of claim 1, further comprising a load module configured to determine that the load is not drawing power and is not providing power to the DC link capacitor in response to the power suspension module suspending power flow between the DC source and the DC link capacitor and suspending power flow between the load and the DC link capacitor, wherein the measurement module measures the first voltage, the second voltage, and/or the third voltage in response to the load module determining that the load is not drawing power and is not providing power to the DC link capacitor.

4. The component of claim 3, wherein the load module determines that the load is not drawing power and is not providing power to the DC link capacitor prior to the measurement module determining each of the first voltage, the second voltage, and the third voltage.

5. The component of claim 1, wherein the capacitance module determines the current capacitance using the equation:

$$C = \frac{2\Delta t_1}{R \cdot \ln\left(\frac{V_1^2 - V_2^2}{V_2^2 - V_3^2} \cdot \frac{\Delta t_2}{\Delta t_1}\right)}$$

wherein:
- C is the current capacitance of the DC link;
- R is resistance of the bleeding resistor;
- $V_1$ is the first voltage;
- $V_2$ is the second voltage;
- $V_3$ is the third voltage;
- $\Delta t_1$ is a time difference between the first time and the second time; and
- $\Delta t_2$ is a time difference between the second time and the third time.

6. The component of claim 1, wherein a time difference between the first time and the second time is equal to a time difference between the second time and the third time.

7. The component of claim 6, wherein the capacitance module determines the current capacitance using the equation:

$$C = \frac{2\Delta t}{R \cdot \ln\left(\frac{V_1^2 - V_2^2}{V_2^2 - V_3^2}\right)}$$

wherein:
- C is the current capacitance of the DC link;
- R is resistance of the bleeding resistor;
- $V_1$ is the first voltage;
- $V_2$ is the second voltage;
- $V_3$ is the third voltage; and
- $\Delta t$ is the time difference between the first time and the second time and/or the time difference between the second time and the third time.

8. The component of claim 6, wherein the capacitance module determines the current capacitance using the equation:

$$C = \frac{\left(V_{avg1}^2 - V_{avg2}^2\right)\Delta t}{R\left(V_{avg1}^2 \ln\frac{V_1}{V_2} - V_{avg2}^2 \ln\frac{V_2}{V_3}\right)}$$

wherein:
- C is the current capacitance of the DC link;
- R is resistance of the bleeding resistor;
- $V_1$ is the first voltage;
- $V_2$ is the second voltage;
- $V_3$ is the third voltage;

$$V_{avg1}^2 = 0.5(V_1 - V_2);$$

$$V_{avg2}^2 = 0.5(V_2 - V_3);$$

$\Delta t$ is the time difference between the first time and the second time and/or the time difference between the second time and the third time.

9. The component of claim 1, wherein the DC link capacitor comprises two or more sections of capacitors connected in series and wherein each of the two or more sections of capacitors comprises a bleeding resistor connected in parallel and wherein the resistance of the bleeding resistor used by the capacitance module comprises a resistance of a series equivalent resistance of the bleeding resistors connected in parallel with the two or more sections of capacitors.

10. The component of claim 1, further comprising an auxiliary power module configured to calculate the power drawn by the auxiliary power supply using the equation:

$$P = \frac{V_2^4 - V_1^2 V_3^2}{\left(V_1^2 - 2V_2^2 + V_3^2\right)R}$$

wherein:
- P is the power drawn by the auxiliary power supply;
- R is resistance of the bleeding resistor;
- $V_1$ is the first voltage;
- $V_2$ is the second voltage; and
- $V_3$ is the third voltage.

11. A method comprising:
- suspending power flow between a direct current ("DC") source and a DC link capacitor of a power converter and to suspend power flow between the DC link capacitor and a load of the power converter, a bleeding resistor is connected in parallel with the DC link capacitor and an auxiliary power supply draws power from the DC link capacitor, the auxiliary power supply providing control power for the power converter;
- measuring, using a voltage sensing circuit to measure voltage across the DC link capacitor, a first voltage at a first time, a second voltage at a second time, and a third voltage at a third time in response to suspending power from or to the DC source and power to or from the load;
- using a resistance of the bleeding resistor, the first, second and third voltages and the first, second and third times to determine a current capacitance of the DC link capacitor;
- comparing the current capacitance with an initial capacitance of the DC link capacitor; and
- sending an alert in response to determining that a difference between the current capacitance and the initial capacitance is above a capacitance degradation threshold.

12. The method of claim 11, wherein determining the current capacitance comprises determining the current capacitance without measuring or knowing an amount of power drawn by the auxiliary power supply.

13. The method of claim 11, further comprising determining that the load is not drawing power and is not providing power to the DC link capacitor in response to suspending power flow between the DC source and the DC link capacitor and suspending power flow between the load and the DC link capacitor, wherein measuring the first voltage, the second voltage, and/or the third voltage is in response to determining that the load is not drawing power and is not providing power to the DC link capacitor.

14. The method of claim 13, wherein determining that the load is not drawing power and is not providing power to the DC link capacitor comprises determining that the load is not drawing power and is not providing power to the DC link capacitor prior determining each of the first voltage, the second voltage, and the third voltage.

15. The method of claim 11, wherein determining the current capacitance comprises using the equation:

$$C = \frac{2\Delta t_1}{R \cdot \ln\left(\frac{V_1^2 - V_2^2}{V_2^2 - V_3^2} \cdot \frac{\Delta t_2}{\Delta t_1}\right)}$$

wherein:
C is the current capacitance of the DC link;
R is resistance of the bleeding resistor;
$V_1$ is the first voltage;
$V_2$ is the second voltage;
$V_3$ is the third voltage;
$\Delta t_1$ is a time difference between the first time and the second time; and
$\Delta t_2$ is a time difference between the second time and the third time.

16. The method of claim 11, wherein a time difference between the first time and the second time is equal to a time difference between the second time and the third time.

17. The method of claim 16, wherein determining the current capacitance comprises using the equation:

$$C = \frac{2\Delta t}{R \cdot \ln\left(\frac{V_1^2 - V_2^2}{V_2^2 - V_3^2}\right)}$$

wherein:
C is the current capacitance of the DC link;
R is resistance of the bleeding resistor;
$V_1$ is the first voltage;
$V_2$ is the second voltage;
$V_3$ is the third voltage; and
$\Delta t$ is the time difference between the first time and the second time and/or the time difference between the second time and the third time.

18. The method of claim 16, wherein determining the current capacitance comprises using the equation:

$$C = \frac{(V_{avg1}^2 - V_{avg2}^2)\Delta t}{R\left(V_{avg1}^2 \ln\frac{V_1}{V_2} - V_{avg2}^2 \ln\frac{V_2}{V_3}\right)}$$

wherein:
C is the current capacitance of the DC link;
R is resistance of the bleeding resistor;
$V_1$ is the first voltage;
$V_2$ is the second voltage;
$V_3$ is the third voltage;

$$V_{avg1}^2 = 0.5(V_1 - V_2);$$

$$V_{avg2}^2 = 0.5(V_2 - V_3);$$

$\Delta t$ is the time difference between the first time and the second time and/or the time difference between the second time and the third time.

19. The method of claim 11, further comprising calculating the power drawn by the auxiliary power supply using the equation:

$$P = \frac{V_2^4 - V_1^2 V_3^2}{(V_1^2 - 2V_2^2 + V_3^2)R}$$

wherein:
P is the power drawn by the auxiliary power supply;
R is resistance of the bleeding resistor;
$V_1$ is the first voltage;
$V_2$ is the second voltage; and
$V_3$ is the third voltage.

20. A computer program product comprising a non-transitory computer readable storage medium having program code embodied therein, the program code executable by a processor to:
suspend power flow between a direct current ("DC") source and a DC link capacitor of a power converter and to suspend power flow between the DC link capacitor and a load of the power converter, the DC link capacitor comprising a bleeding resistor connected in parallel with the DC link capacitor, and an auxiliary power supply drawing power from the DC link capacitor, the auxiliary power supply providing control power for the power converter;
measure, using a voltage sensing circuit to measure voltage across the DC link capacitor, a first voltage at a first time, a second voltage at a second time, and a third voltage at a third time in response to suspending power from or to the DC source and power to or from the load;
use a resistance of the bleeding resistor, the first, second and third voltages and the first, second and third times to determine a current capacitance of the DC link capacitor;
compare the current capacitance with an initial capacitance of the DC link capacitor; and
send an alert in response to determining that a difference between the current capacitance and the initial capacitance is above a capacitance degradation threshold.

* * * * *